US011521658B2

(12) United States Patent
Choi et al.

(10) Patent No.: US 11,521,658 B2
(45) Date of Patent: Dec. 6, 2022

(54) BINARY WEIGHTED VOLTAGE ENCODING SCHEME FOR SUPPORTING MULTI-BIT INPUT PRECISION

(71) Applicant: SanDisk Technologies LLC, Addison, TX (US)

(72) Inventors: Won Ho Choi, San Jose, CA (US); Pi-Feng Chiu, Milpitas, CA (US); Martin Lueker-Boden, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 737 days.

(21) Appl. No.: 16/460,947

(22) Filed: Jul. 2, 2019

(65) Prior Publication Data

US 2020/0411065 A1 Dec. 31, 2020

Related U.S. Application Data

(63) Continuation-in-part of application No. 16/452,442, filed on Jun. 25, 2019, now abandoned.

(51) Int. Cl.
*G11C 5/14* (2006.01)
*G11C 13/00* (2006.01)
(Continued)

(52) U.S. Cl.
CPC .............. *G11C 5/147* (2013.01); *G06F 17/16* (2013.01); *G06N 3/04* (2013.01); *G06N 3/0635* (2013.01);
(Continued)

(58) Field of Classification Search
CPC .......... G06N 3/0635; G06N 3/04; G06N 3/08; G06N 3/0481; G11C 5/14; G11C 7/16;
(Continued)

(56) References Cited

U.S. PATENT DOCUMENTS 6,233,276 B1 * 5/2001 Simeon ............... H04L 27/2647
375/232
10,528,643 B1   1/2020 Choi et al.
(Continued)

FOREIGN PATENT DOCUMENTS

JP       2008310900 A  * 12/2008

OTHER PUBLICATIONS

Notice of Allowance dated May 5, 2021, U.S. Appl. No. 16/899,722, filed Jun. 12, 2020.
(Continued)

*Primary Examiner* — Michael T Tran
(74) *Attorney, Agent, or Firm* — Vierra Magen Marcus LLP

(57) ABSTRACT

An illustrative embodiment disclosed herein is an apparatus including a non-volatile memory cell and multi-bit input circuitry that simultaneously receives a plurality of bits, receives a supply voltage, converts the plurality of bits and the supply voltage into a multiply voltage, and applies the multiply voltage to the non-volatile memory cell. The non-volatile memory cell may pass a memory cell current in
(Continued)

response to the multiply voltage. A magnitude of the multiply voltage may represent a multiplier. The memory cell current may represent a product of the multiplier and a multiplicand stored in the non-volatile memory cell.

20 Claims, 18 Drawing Sheets

(51) Int. Cl.
| | |
|---|---|
| *G11C 11/22* | (2006.01) |
| *G06F 17/16* | (2006.01) |
| *G11C 11/16* | (2006.01) |
| *G11C 5/06* | (2006.01) |
| *G06N 3/08* | (2006.01) |
| *G06N 3/063* | (2006.01) |
| *G06N 3/04* | (2006.01) |

(52) U.S. Cl.
CPC ............... *G06N 3/08* (2013.01); *G11C 5/063* (2013.01); *G11C 11/1697* (2013.01); *G11C 11/223* (2013.01); *G11C 11/2297* (2013.01); *G11C 13/0038* (2013.01)

(58) Field of Classification Search
CPC . G11C 11/1657; G11C 11/54; G11C 13/0028; G11C 7/1006; H03M 1/808; H03M 1/765
USPC ...................................... 706/35, 25
See application file for complete search history.

(56) References Cited

U.S. PATENT DOCUMENTS

| | | | |
|---|---|---|---|
| 10,534,840 B1* | 1/2020 | Petti | G11C 7/12 |
| 10,580,492 B2 | 3/2020 | Tiwari et al. | |
| 10,643,119 B2 | 5/2020 | Chiu et al. | |
| 10,832,783 B1 | 11/2020 | Wei | |
| 10,886,458 B2 | 1/2021 | Choi et al. | |
| 10,957,392 B2 | 3/2021 | Lee et al. | |
| 2014/0173238 A1* | 6/2014 | Ware | H04L 9/065 |
| | | | 711/163 |
| 2015/0189214 A1* | 7/2015 | Kurose | H04N 5/37455 |
| | | | 250/208.1 |
| 2017/0115709 A1* | 4/2017 | Fukuzawa | H03L 1/022 |
| 2017/0117903 A1* | 4/2017 | Fukuzawa | H03L 1/02 |
| 2019/0392299 A1 | 12/2019 | Ma | |
| 2020/0020393 A1* | 1/2020 | Al-Shamma | G11C 16/10 |
| 2020/0041065 A1 | 2/2020 | Choi et al. | |
| 2020/0125328 A1* | 4/2020 | Paulsen | H03M 1/46 |
| 2020/0160158 A1* | 5/2020 | Okamoto | G06F 7/50 |
| 2020/0401373 A1 | 12/2020 | Lesso | |

OTHER PUBLICATIONS

U.S. Appl. No. 16/899,722, filed Jun. 12, 2020.
Non-Final Office Action dated Apr. 5, 2022, U.S. Appl. No. 16/452,442, filed Jun. 25, 2019.

* cited by examiner

BINARY WEIGHTED VOLTAGE ENCODING SCHEME FOR SUPPORTING MULTI-BIT INPUT PRECISION

CROSS-REFERENCE TO RELATED APPLICATION

This application is a continuation-in-part of and claims priority under 35 U.S. § 120 from U.S. patent application Ser. No. 16/452,442, filed Jun. 25, 2019, and published as US 2020/0410334 on Dec. 31, 2020, titled "BINARY WEIGHTED VOLTAGE ENCODING SCHEME FOR SUPPORTING MULTI-BIT INPUT PRECISION," the entire contents of which are incorporated herein by reference for all purposes.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A nonvolatile memory device allows information to be stored or retained even when the nonvolatile memory device is not connected to a source of power (e.g., a battery).

Examples of non-volatile memory include, but are not limited to, magnetoresistive memory (e.g., MRAM), phase change memory (e.g., PCM) ferroelectric field effect transistor (FeFET) memory, ferroelectric memory (e.g., FeRAM), and flash memory (e.g., NAND-type and NOR-type flash memory).

SUMMARY

An illustrative embodiment disclosed herein is an apparatus including a non-volatile memory cell and multi-bit input circuitry that simultaneously receives a plurality of bits, receives a supply voltage, converts the plurality of bits and the supply voltage into a multiply voltage, and applies the multiply voltage to the non-volatile memory cell. The non-volatile memory cell may pass a memory cell current in response to the multiply voltage. A magnitude of the multiply voltage may represent a multiplier. The memory cell current may represent a product of the multiplier and a multiplicand stored in the non-volatile memory cell.

Another illustrative embodiment disclosed herein is a non-volatile memory system including a plurality of non-volatile memory cells. The plurality of non-volatile memory cells may include "n" rows of non-volatile memory cells and "m" columns of non-volatile memory cells. The non-volatile memory system may include "n" first conductive lines. Each row of non-volatile memory cells may be coupled to a corresponding one of the "n" first conductive lines. The non-volatile memory system may include "m" second conductive lines. Each column of non-volatile memory cells may be coupled to a corresponding one of the "m" second conductive lines. The non-volatile memory system may include multi-bit input circuitry that simultaneously receives a plurality of bits, receives a supply voltage, converts the plurality of bits and the supply voltage into "n" multiply voltages, and applies each of the "n" multiply voltages to the corresponding one of the "n" first conductive lines. Each column of non-volatile memory cells may provide a current to the corresponding one of the "m" second conductive lines. A magnitude of a sum of the "n" multiply voltages may represent a multiplier. The non-volatile memory system may include a binary weighted summation circuit that multiplies a magnitude of the memory cell current from each column of memory cell by a different power of two to produce a multiplied signal for each column of memory cells and sums the multiplied signals to generate a summed signal that represents a product of the multiplier and a multiplicand stored in each of the plurality of non-volatile memory cells.

Another illustrative embodiment disclosed herein is a non-volatile memory system including a plurality of non-volatile memory cells. The plurality of non-volatile memory cells may include "n×r" rows of non-volatile memory cells and "m" columns of non-volatile memory cells. The non-volatile memory system may include "n×r" first conductive lines. Each row of non-volatile memory cells may be coupled to a corresponding one of the "n×r" first conductive lines. The "n×r" first conductive lines may include "r" groups of "n" first conductive lines. The non-volatile memory system may include "m" second conductive lines. Each column of non-volatile memory cells may be coupled to a corresponding one of the "m" second conductive lines. The non-volatile memory system may include "r" multi-bit input circuits. Each multi-bit input circuit may be coupled to a corresponding group of "n" first conductive lines. Each multi-bit input circuit may simultaneously receive a plurality of bits, receive a supply voltage, convert the plurality of bits and the supply voltage into "n" multiply voltages, and apply each of the "n" multiply voltages to a corresponding first conductive line of the corresponding group of "n" first conductive lines. Each column of non-volatile memory cells may cause a current in the corresponding one of the "m" second conductive lines. A magnitude of a sum of the "n" multiply voltages may represent one of "r" vector elements of a first vector. The non-volatile memory system may include a binary weighted summation circuit that multiplies a magnitude of the memory cell current from each column of memory cell by a different power of two to produce a multiplied signal for each column of memory cells and sums the multiplied signals to generate a summed signal that represents a multiplication of the first vector and a second vector stored in each of the plurality of non-volatile memory cells.

DETAILED DESCRIPTION

Figure 1A:
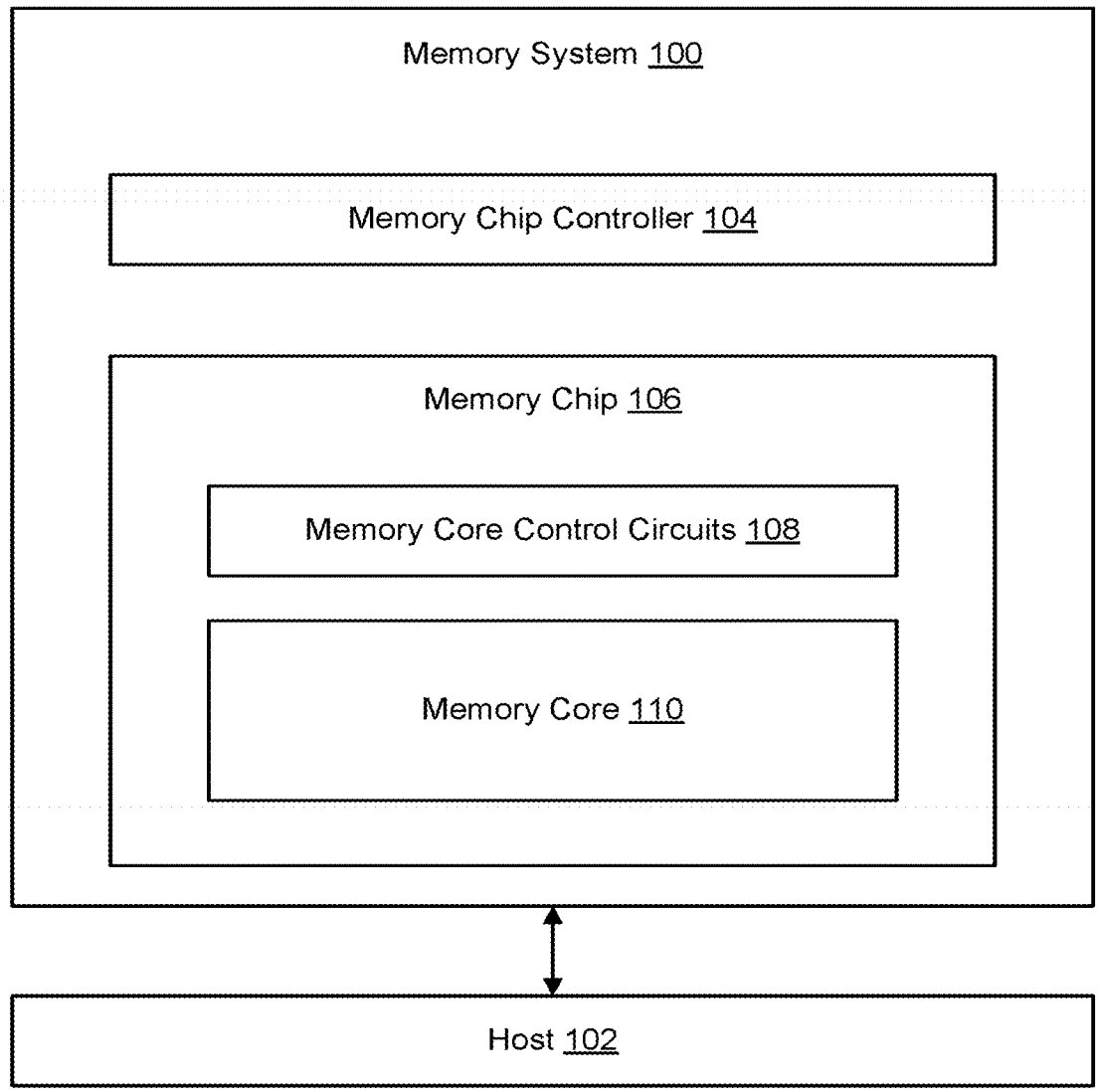
FIG. 1A depicts an embodiment of a memory system and a host.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

A non-volatile memory (NVM) system including binary NVM cells can perform vector-vector multiplication (VVM) and vector-matrix multiplication (VMM). In one embodiment, the VVM and VMM capabilities of the NVM system can be exploited to implement a multi-layer perception (MLP) neural network. MLP neural network may be used for simple classification such as hand written letter recognition. Types of binary NVM cells used for MLP neural network applications include magnetoresistive memory (MRAM), resistive random access memory (ReRAM), and phase change memory (PCM). In one embodiment, MRAM has a lower read time, a lower write time, a higher endurance, and a lower write energy/bit than the ReRAM and PCM embodiments.

Some embodiments of the NVM system implementation of MLP neural networks using MRAM binary NVM cells not contemplated by the present disclosure do not support multi-bit inputs to each of the binary NVM cells. However, for a predetermined number of iterations, embodiments not supporting multi-bit inputs generate less accurate neural network weights than their counterparts supporting multi-bit inputs. In other words, embodiments not supporting multi-bit inputs require more iterations to tune the neural network weights to a predetermined accuracy than their counterparts supporting multi-bit inputs. Some embodiments of the NVM system not contemplated by the present disclosure support multi-bit inputs using a sequential input scheme. In the sequential input scheme, a two-bit input is received sequentially in one clock cycle. However, the clock period is increased, which increases latency. What is needed is an embodiment of an NVM system implementation of MLP neural networks using MRAM binary NVM cells that can support a multi-bit input to improve accuracy without increasing latency.

In some embodiments of the disclosure described herein, an NVM system using MRAM binary NVM cells can support a multi-bit input. In one embodiment, the NVM system includes multi-bit input circuitry and NVM cells. In one embodiment, the multi-bit input circuitry simultaneously receives a word of bits and a supply voltage. The multi-bit input circuitry converts the plurality of bits and the supply voltages into one or more multiply voltages, in one embodiment. In one embodiment, the multi-bit input circuitry applies the multiply voltages to corresponding NVM cells. The NVM cells pass memory cell currents, in one embodiment. In one embodiment, the memory cell currents represent a product of the multiply voltages and a multiplicand stored in the NVM cells. Some embodiments of the NVM cells include a resistor (1R), a resistor and a selector (1S1R), and a resistor and a transistor (1T1R). In one embodiment of the NVM system using 1S1R and 1T1R, the multi-bit input circuitry generates the multiply voltages by adding intermediate multiply voltages to corresponding selector voltages for biasing the selector or the transistor.

Advantageously, some embodiments of the disclosure described herein leverage the benefits of MRAM technology, such as a lower read time, a lower write time, a higher endurance, and a lower write energy/bit than the ReRAM and PCM technology counterparts. Some embodiments of the disclosure described herein improve the accuracy of tuning weights of a neural network through use of multi-bit inputs without increasing latency. Moreover, in some embodiments, the NVM system ensures that the none of the multiply voltages exceed a maximum read voltage and that there is a linear relationship between a value of the multi-bit input and a magnitude of the current passed by the NVM cells.

Memory System

Prior to further discussion of multiplication using non-volatile memory cells and multi-bit inputs for each weight, an example memory system 100 in which embodiments may be practiced will be discussed. FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102. In one embodiment, memory system 100 is used as a neuromorphic computing system.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, or reading (or sensing) operations. The managing or control circuits are used to perform multiplication using non-volatile memory cells, in one embodiment. Herein, multiplication will be referred to as a type of memory array operation.

In some embodiments, the managing or control circuits (or a portion of the managing or control circuits) for facilitating one or more memory array operations (including multiplication) may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, or generating row and column addresses. Memory core control circuits 108 may include logic for controlling the generation of voltage references for biasing a particular memory array in order to perform multiplication using non-volatile memory cells.

Memory chip controller 104 controls operation of memory chip 106. Once a read, write, or multiply operation is initiated by memory chip controller 104, memory core control circuits 108 may generate the appropriate bias voltages for bit lines, source lines and/or word lines within memory core 110, and generate the appropriate memory block, row, and column addresses.

In some embodiments, one or more managing or control circuits may be used for controlling the operation of a memory array. The one or more managing or control circuits may provide control signals to a memory array to perform a read operation, a write operation and/or a multiply operation on the memory array. In one example, the one or more managing or control circuits may include any one of or a combination of control circuitry, state machine, decoders, sense amplifiers, read/write/multiply circuits, and/or controllers. The one or more managing circuits may perform or facilitate one or more memory array operations including erasing, programming, reading operations, or multiply operations. In one example, one or more managing circuits may include an onchip memory controller for determining row and column address, bit line, source line and word line addresses, memory array enable signals, and data latching signals.

Memory core 110 may include one or more two-dimensional arrays of memory cells or one or more three-dimensional arrays of memory cells. In one embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

In one embodiment, memory core 110 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate.

The exact type of memory array architecture or memory cell included in memory core 110 is not limited to the examples above. Many different types of memory array architectures or memory technologies can be used to form memory core 110. No particular non-volatile memory technology is required for purposes of the new claimed embodiments proposed herein. Other examples of suitable technologies for memory cells of the memory core 110 include ReRAM memories, ferroelectric field effect transistor (FeFET) memory, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory core 110 include two dimensional arrays, three dimensional arrays, cross-point arrays, stacked two dimensional arrays, vertical bit line arrays, and the like.

One example of a ReRAM, or PCMRAM, cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A ferroelectric field effect transistor (FeFET) memory has an adjustable threshold voltage (Vt) transistor that has an adjustable threshold voltage. The adjustable Vt transistor has a low threshold voltage state and a high threshold voltage state, in one embodiment. The adjustable Vt transistor can be repeatedly switched between the low threshold voltage state and the high threshold voltage state.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
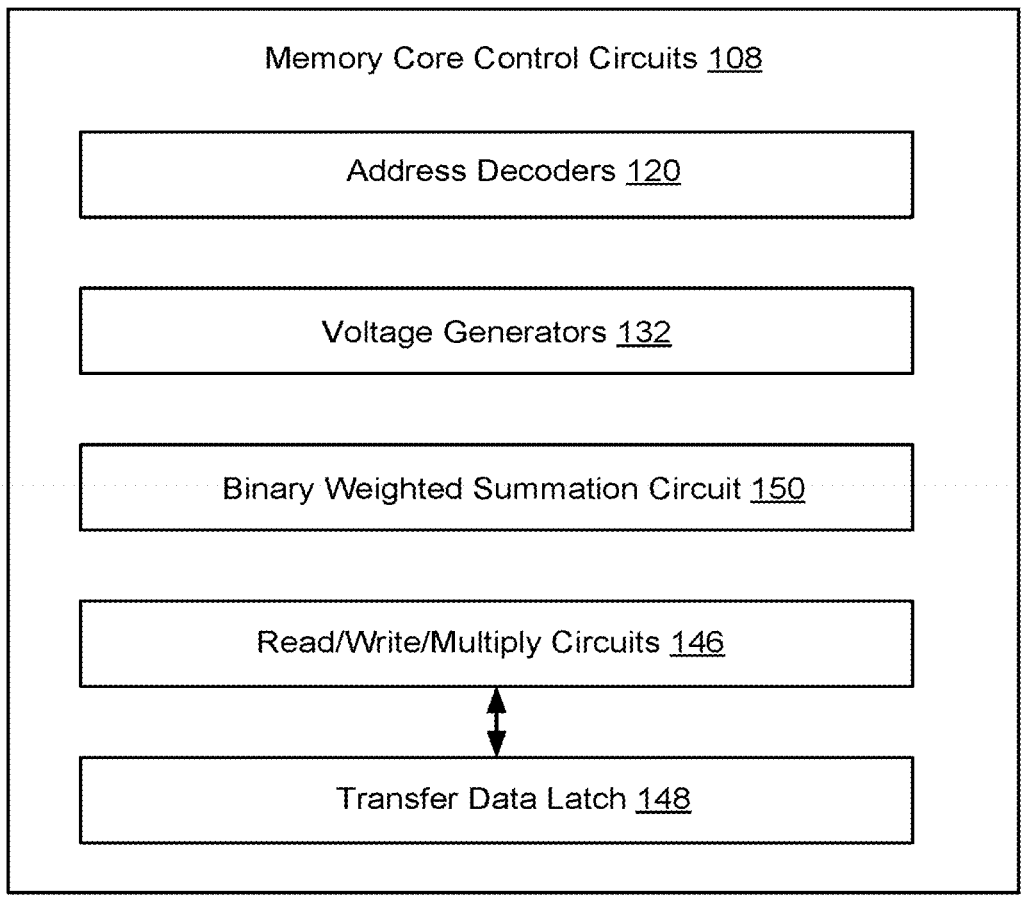
FIG. 1B depicts an embodiment of memory core control circuits.

FIG. 1B depicts an embodiment of memory core control circuits 108. As depicted, memory core control circuits 108 include address decoders 120, voltage generators 132, transfer data latch 148, read/write/multiply circuits 146, and binary weighted summation circuit 150. The voltage generators (or voltage regulators) 132 may generate voltages for control lines.

Read/write/multiply circuits 146 include circuitry for reading and writing memory cells in the memory core 110. In an embodiment, transfer data latch 148 is used or intermediate storage between memory chip controller 104 (FIG. 1A) and memory cells. In an embodiment, when host 102 instructs memory chip controller 104 to write data to memory chip 106, memory chip controller 104 writes host data to transfer data latch 148. Read/write circuits 146 then write data from transfer data latch 148 to a specified page of memory cells. In an embodiment, transfer data latch 148 has a size equal to the size of a page. In an embodiment, when host 102 instructs memory chip controller 104 to read data from memory chip 106, read/write circuits 146 read from a specified page into transfer data latch 148, and memory chip controller 104 transfers the read data from transfer data latch 148 to host 102. Address decoders 120 may generate memory block addresses, as well as row addresses and column addresses for a particular memory block.

The read/write/multiply circuits 146 also include circuitry for performing multiply operations using memory cells. In one embodiment, the write circuit is used to store multiplicands in the memory cells. The write circuit stores a multiplicand into a node of "r" memory cells, in one embodiment. In one embodiment, the multiplicand has "r" bits. Each memory cell in a node stores one of the "r" bits of the multiplicand, in one embodiment.

In one embodiment, the multiply circuit is used to apply multiply voltages to memory cells that store multiplicands. Each multiply voltage has a magnitude that represents a multiplier, in one embodiment. Each memory cell in a node passes a memory cell current in response to the multiply voltage, in one embodiment. The magnitude of the memory cell current depends on the physical state of the memory cell and the magnitude of the multiply voltage, in one embodiment. For example, the magnitude of a memory cell current depends on the resistance of the memory cell and the voltage applied between two terminals of the memory cell, in one embodiment. The magnitude of the memory cell current depends on whether the memory cell is in a first physical state or a second physical state, in one embodiment. Each physical state may be represented by a physical parameter including, but not limited to, a memory cell resistance, or a memory cell transistor threshold voltage.

The multiply voltage may be similar in magnitude to a read voltage, in that the multiply voltage may cause the memory cell to pass the memory cell current without changing the physical state of the memory cell. However, whereas a read voltage may have a magnitude that is selected to delineate between physical states, the magnitude of the multiply voltage is not necessarily selected to delineate between physical states. The following examples of a memory cell programmed to one of two states will be used to illustrate. After a read voltage is applied, the memory cell current may be sensed and compared with a reference current to determine which state the memory cell is in. In this case, the magnitude of the read voltage and reference current may be selected to be able to delineate between the two states. However, the multiply voltage could have one of many different magnitudes, depending on what multiplier is desired. Moreover, the memory cell current that results from applying the multiply voltage is not necessarily compared to a reference current.

The binary weighted summation circuit 150 may be used during multiplication. The binary weighted summation circuit 150 is configured to process each of the memory cell currents from one or more nodes of memory cells. The binary weighted summation circuit 150 multiplies the magnitude of the memory cell current from each memory cell in a selected node by a different power of two to pass a multiplied signal for each memory cell, and sums the multiplied signals for the selected node, in one embodiment. Thus, the binary weighted summation circuit 150 may generate a summed signal that represents a product of the multiplier times a multiplicand stored in the selected node.

The binary weighted summation circuit 150 may also be used to generate a summed signal that represents a dot product of two vectors. A column of nodes is used to store elements of a first vector, in one embodiment. The column of nodes is associated with "r" bit lines, in one embodiment. Each node may have "r" non-volatile memory cells, wherein each bit line is associated with one memory cell in each of the nodes. The multiply circuit may simultaneously apply a different multiply voltage to each node. Each multiply voltage may correspond to an element of a second vector. The binary weighted summation circuit 150 may multiply the current in each bit line by a different power of two, and sum the multiplied currents in the "r" bit lines to generate a vector multiplication result signal that represents multiplication of the first vector by the second vector.

Figure 1C:
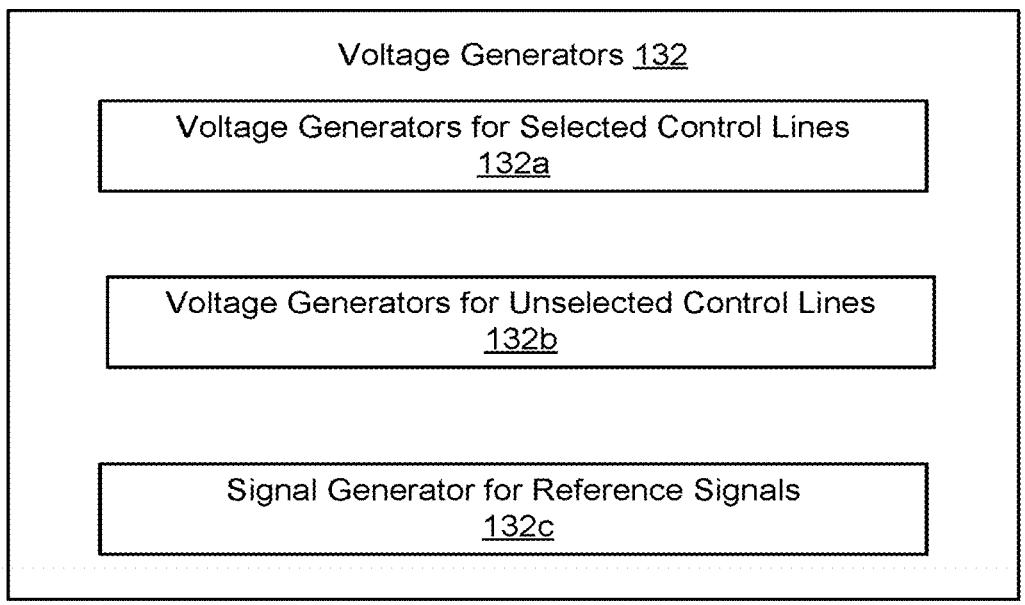
FIG. 1C depicts further details of one embodiment of voltage generators.

FIG. 1 C depicts further details of one embodiment of voltage generators 132. The voltage generators include voltage generators for selected control lines 132a, voltage generators for unselected control lines 132b, and signal generators for reference signals 132c. Control lines may include bit lines, source lines and word lines, or a combination of bit lines, source lines and word lines. Voltage generators for selected control lines 132a may be used to generate program, read, and/or multiply voltages. In one embodiment, the voltage generators for selected control lines 132a generate a voltage whose magnitude is based on a multiplier for a mathematical multiplication operation. In one embodiment, the voltage difference between the voltages for two selected control lines is a multiply voltage.

Voltage generators for unselected control lines 132b may be used to generate voltages for control lines that a connected to memory cells that are not selected for a program, read, or multiply operation. The signal generators for reference signals 132c may be used to generate reference signals (e.g., currents, voltages) to be used as a comparison signal to determine the physical state of a memory cell.

Memory Cell Multiplication

In one embodiment, a multiplicand is stored in a node that includes multiple non-volatile memory cells. In some embodiments, each memory cell in the node is programmed to one of two physical states. Herein, a "physical state" may be referred to more briefly as a "state." In one embodiment, the memory cells in the nodes are "binary non-volatile memory cells." A "binary non-volatile memory cell," as the term is defined herein, is a non-volatile memory cell that can be repeatedly switched between only two physical states. For the sake of discussion, one state may be referred to as an "on-state" and the other state as an "off-state." The on-state in a "high current state," whereas the off-state is a "low current state," in one embodiment. One state may be used to store a "1" and the other to store a "0."

Multiplication may be performed by applying a multiply voltage to the node of memory cells and processing memory cell currents from the memory cells in the node. The magnitude of the multiply voltage represents a multiplier, in one embodiment. In one embodiment, each memory cell in the node has at least two terminals, such that the multiply voltage may be applied to each memory cell by applying the multiply voltage across two terminals of each memory cells. Each memory cell in the node responds to the multiply voltage by passing a memory cell current, in one embodiment. Each memory cell in the node responds to the multiply voltage by causing a memory cell current in a bit line, in one embodiment. In one embodiment, the magnitude of the memory cell current from each memory cell in the node is multiplied by a different power of two to produce a multiplied signal for each memory cell. The multiplied signals are summed to generate a "summed signal." in one embodiment. The magnitude of the summed signal represents a product of the multiplier and a multiplicand stored in the node.

In order to achieve precise multiplication, both the multiplier and multiplicand should be able to represent multiple different values. It is not necessarily challenging to precisely generate a voltage that has one of multiple possible magnitudes. Hence, if the multiplier is represented by the magnitude of a voltage, a wide range of multipliers can precisely be achieved. Note that herein, the term "multiplier" is used for the multiply voltage, and the term "multiplicand" is used for the value stored in the node of memory cells. This is for convenience of discussion. The terms "multiplier" and "multiplicand," as used herein, are interchangeable.

One embodiment overcomes such limitations by storing a multiplicand in a selected node of multiple non-volatile memory cells, where each memory cell in the selected node stores a different bit of the multiplicand. A multiply voltage is simultaneously applied to each non-volatile memory cell in the selected node to cause each memory cell to pass a memory cell current. The magnitudes of the memory cell currents are multiplied by a different power of two to pass a multiplied signal for each memory cell, and the multiplied memory cell signals are summed to generate a summed signal. The summed signal represents a product of the multiplier times a multiplicand stored in the selected node. In one embodiment, vector/vector multiplication is performed using a column of nodes of non-volatile memory cells.

Figure 2A:
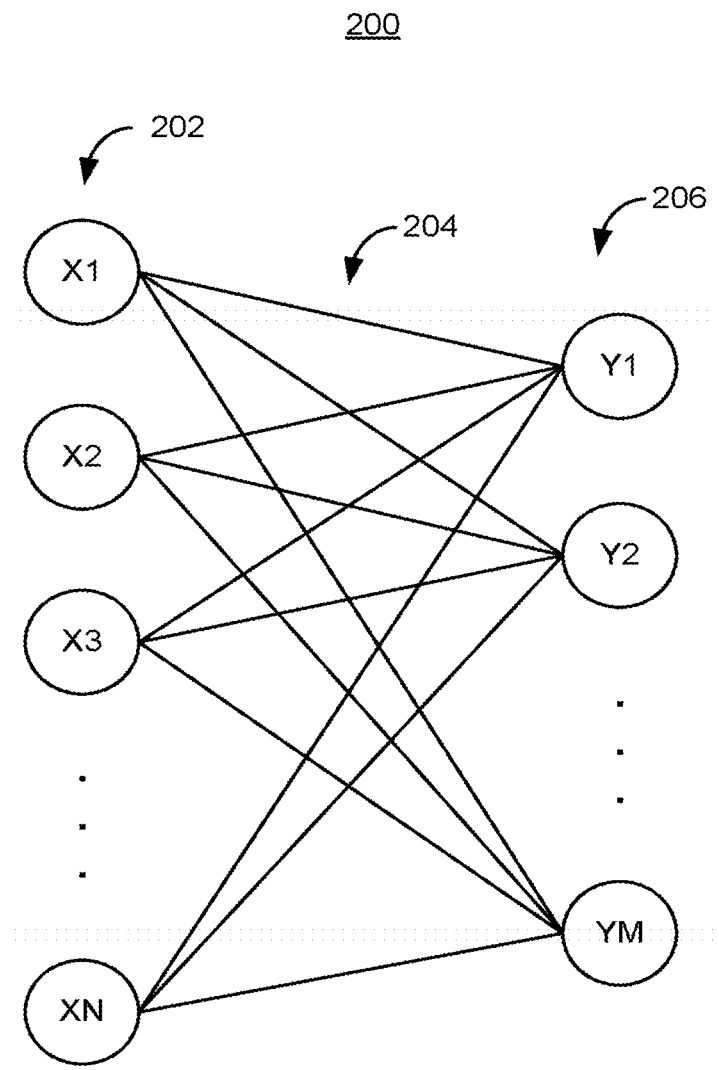
FIG. 2A shows an example of an N to M artificial neural network.

In one embodiment, non-volatile memory cells are used to perform multiplication in a neuromorphic computing system. A neuromorphic computing system may be used to implement an artificial neural network. FIG. 2A shows an example of an N to M artificial neural network 200. The artificial neural network 200 has "N" input neurons 202 and "M" output neurons 206. A number of synapses 204 connect input neurons 202 to output neurons 206. Each of the input neurons 202 may be associated with a mathematical number. Likewise, each of the synapses 204 may be associated with a mathematical number, which is typically referred to as a "weight." Equation 1 represents a calculation that may be performed for each of the "M" output neurons 206.

$$Y_M = \sum_1^N X_N \times W_{NM} \quad \text{Eq. 1}$$

In Equation 1, $Y_M$ represents the output neuron 206 for which Equation 1 is presently being applied; $X_N$ represents the input neurons 202; and $W_{NM}$ represents the weight of the synapse 204 that connects one input neuron 202 to the output neuron 206 for which Equation 1 is presently being applied ($Y_M$). As noted above, each synapse has a "weight". Thus, Equation 1 may be implemented by a multiply and accumulate of the product of the values of the N input neuron 202 by the weight of the synapse 204 that connects each respective input neuron 202 to $Y_M$. The multiply and accumulate can also be referred to as a vector/vector multiply (e.g., dot product of two vectors). The first vector being an "n" element vector defined by the values for the N input neuron 202, and the second vector being an "n" element vector defined by the weights of the N synapses 204 that connect the N input neurons 202 to $Y_M$.

Figure 2B:
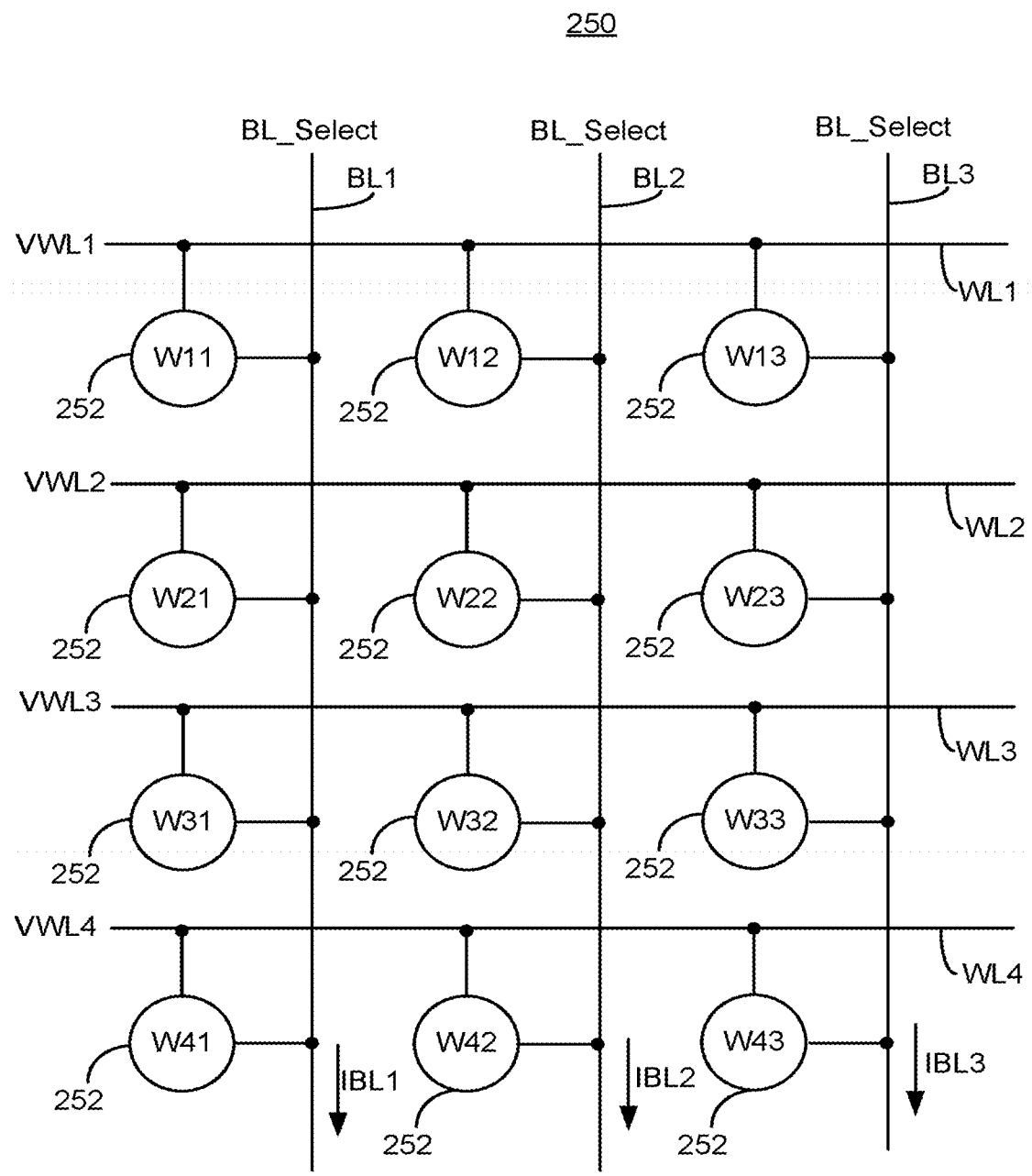
FIG. 2B depicts an example of a portion of a cross-point memory array.

One technique for performing the multiply and accumulate (or vector/vector multiply) is to use a cross-point memory array. FIG. 2B depicts an example of a portion of a cross-point memory array 250. The cross-point memory array 250 may be used to perform a multiply and accumulate operation. The depicted portion of the array 250 has four word lines (WL1, WL2, WL3, WL4) and three bit lines (BL1, BL2, BL3). The depicted portion of the array 250 may be used to execute Equation 1 for a case in which N=4 and M=3.

A number of non-volatile memory cells 252 are depicted. Each non-volatile memory cells 252 could include an adjustable resistor, as one example. Each memory cell 252 is labeled with a weight (e.g., W11, W21, etc.). These weights ($W_{NM}$) correspond to the weights that represent the synapse 204 that connects one input neuron 202 to the output neuron 206. For some types of memory cells, the adjustable resistor can be programmed to a range of resistances. Thus, the weight may be related to the resistance of the adjustable resistor.

VWL1, VWL2, VWL3, and VWL4 are shown being applied to the respective word lines WL1, WL2, WL3, WL4. The magnitudes of these voltages correspond to the input neurons 202. Thus, the set of voltages VWL1, VWL2, VWL3, and VWL4 correspond to $X_N$ in Equation 1. A bit line select voltage (BL_Select) is applied to each bit line to select that bit line. For ease of explanation, it will be assumed that BL_Select is zero volts, such that the voltage across each memory cell 252 is the word line voltage. Each memory cell 252 may pass a current that is based on its resistance and the voltage applied to the memory cell. This "memory cell current" flows to the bit line connected to the memory cell 252. The memory cell current may be viewed as the product of multiplying a mathematical value represented by the word line voltage by a mathematical value represented by the resistance of the memory cell. Stated another way, the memory cell current may be viewed as a representation of the product of multiplying one of the elements of an input vector by the weight stored in the memory cell.

A number of bit line currents (IBL1, IBL2, IBL3) are depicted. Each bit line current is the summation of the currents of the memory cells connected to that bit line. Thus, each bit line current may be viewed as representing an accumulation of the products discussed in the prior paragraph. Therefore, the magnitude of a bit line current may be viewed to represent a vector/vector multiplication (e.g., dot product of two vectors). Furthermore, with reference to Equation 1, the magnitude of a bit line current may represent one of the output neurons (e.g., $Y_M$).

For the architecture in FIG. 2B, in order for the multiply and accumulate to be precise, the weights should be able to have a variety of values. However, some memory cells can only be reliably programmed to two states. Hence, such memory cells may not be suitable for multiply and accumulate (MAC) in the architecture in FIG. 2B. Some memory cells can be programmed to more than two states. For example, some adjustable resistance memory cells can be programmed to more than two resistances. However, for such multi-state memory cells to pass precise MAC in the architecture in FIG. 2B, there should be a linear relationship between the resistance states. Unfortunately, many multi-state memory cells exhibit a non-linear relationship between the resistance states. Therefore, accuracy in MAC may be imprecise when such memory cells are used in the architecture in FIG. 2B.

Figure 3A:
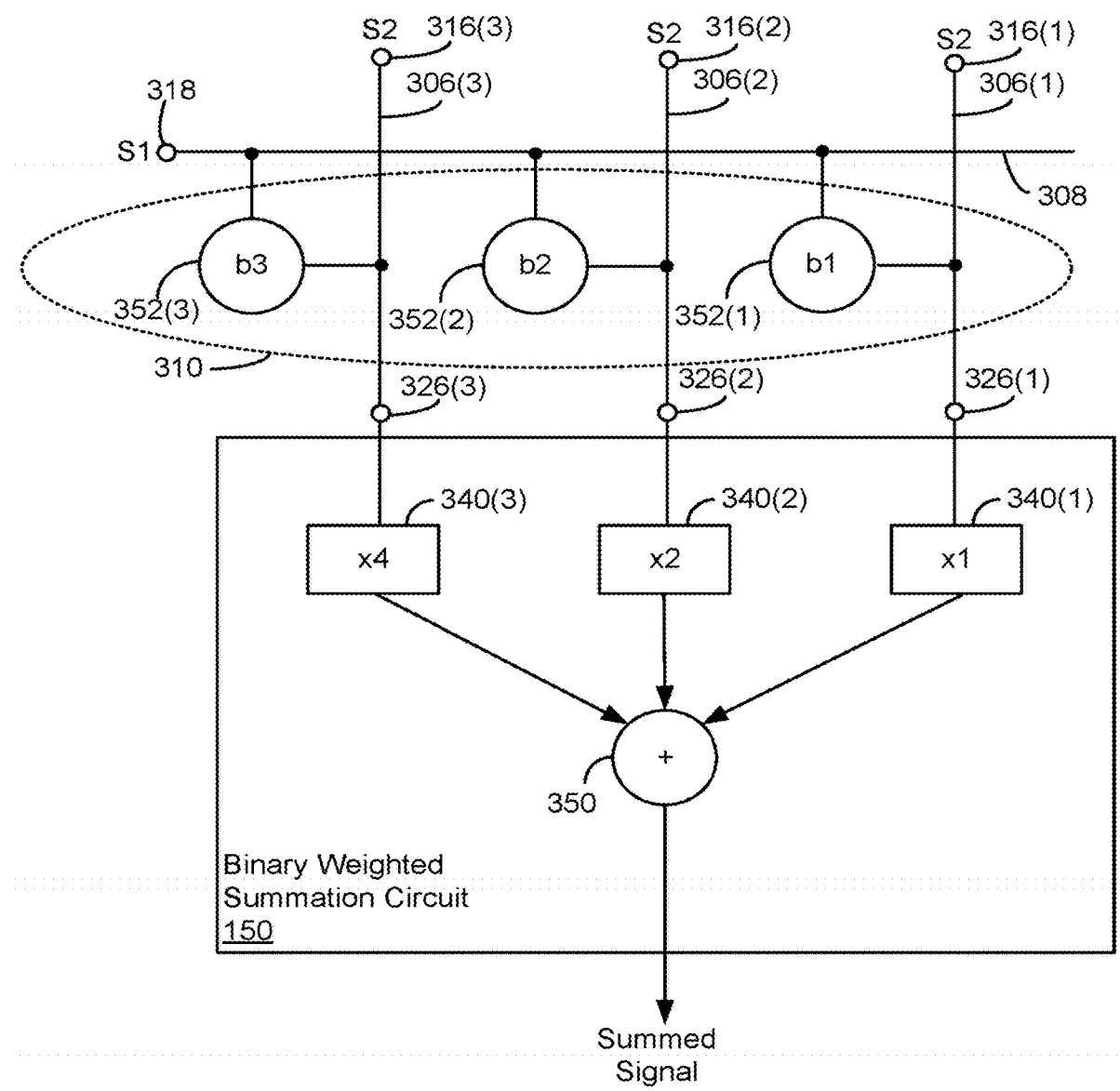
FIG. 3A is a diagram of one embodiment of an apparatus having two-terminal memory cells that may be used to perform multiplication.

FIG. 3A is a diagram of one embodiment of an apparatus 300 that may be used to perform multiplication. The apparatus 300 may be included in a non-volatile storage device. The apparatus is contained within memory system 100, in one embodiment. The apparatus resides on memory chip 106, in one embodiment. FIG. 3 shows one node 310 in a cross-point memory array. The cross-point memory array typically has additional nodes 310. For example, there may be rows and columns of nodes 310. In the embodiment of FIG. 3A, there are three memory cells 352(1), 352(2), 352(3) in the node 310. The reference numeral 352 may be used to refer to a memory cell without reference to a specific memory cell. In general, there may be two or more memory cells 352 per each node 310.

Each memory cell 352 is electrically connected to first conductive line 308. In one embodiment, first conductive line 308 is referred to as a word line. There is a set of second conductive lines 306(1), 306(2), 306(3). The reference numeral 306 may be used to refer to a second conductive without reference to a specific line. In one embodiment, the second conductive lines 306 are referred to as bit lines. Each memory cell 352 in the node 310 is electrically connected to a different second conductive line 306.

Each memory cell 352 is programmed to one of two different states, in one embodiment. For the sake of discussion, one state may be referred to as "0" and the other state as "1". Thus, it may be stated that each memory cell 352 stores one bit. In one embodiment, each memory cell 352 has an adjustable resistor, and the two different states are two different resistances (or alternatively conductances). In one embodiment, each memory cell 352 has a transistor with an adjustable threshold voltage, and the two different states are two different transistor threshold voltages.

A node 310 is a unit of two or more memory cells 352 that may be used to multiply two mathematical values. One mathematical value is stored in the node 310, and the other mathematical value is represented by a voltage applied to the memory cells 352 in the node. The memory cells 352 in the node 310 may be used to collectively store a mathematical value, in one embodiment. In one embodiment, the memory cells 352 in the node 310 collectively store a multiplicand. The multiplicand may be a weight in a neural network. In one embodiment, each memory cell 352 in the node 310 represents a different position in a binary number system. For example, memory cell 352(1) may represent the "1s" position, memory cell 352(2) may represent the "2s" position, and memory cell 352(3) may represent the "4s" position. Thus, the memory cells in the node 310 may collectively store three bits of information, in one embodiment. The number of memory cells 352 in a node 310 relates to the resolution, in one embodiment. For example, the multiplicand may be a value between 0 and 1, such that with three bits the node 310 can represent the following values (0, 0.125, 0.25, 0.375, 0.5, 0.625, 0.75, 0.825). Adding more memory cells 352 to the node 310 can achieve greater resolution for the multiplicand over the same range. The range between 0 and 1 is just one example, as are the example values within the range.

The multiply circuit 146 is configured to apply a multiply voltage to each memory cell. The phrase, "apply a multiply voltage to a memory cell," or the like, means to apply the multiply voltage across two terminals of the memory cell. Moreover, applying a multiply voltage to a memory cell results in a memory cell current that has a magnitude that depends on the physical state (e.g., resistance, Vt) of the memory cell and the magnitude of the multiply voltage. In one embodiment, the magnitude of the memory cell current is a function of the resistance of an adjustable resistor in the memory cell and the magnitude of the multiply voltage. In one embodiment, the magnitude of the memory cell current is a function of the Vt of a transistor in the memory cell and the magnitude of the multiply voltage. The phrase, "apply a multiply voltage to a node of memory cells," or the like, means to apply the same multiply voltage to each memory cell in the node.

The multiply voltage may be applied between the first conductive line 308 and one of the second conductive lines 306 in order to apply the multiply voltage to a memory cell, in the embodiment of FIG. 3A. The first conductive line 308 has a first terminal 318 to which the multiply circuit 146 applies a first signal S1. Each of the second conductive lines 306 has a second terminal 316(1), 316(2), 316(3). The multiply circuit 146 applies a second signal S2 to each of the second terminals 316(1), 316(2), 316(3). Typically, the magnitude of the second signal S2 is the same for each second conductive line 306(1), 306(2), 306(3) associated with the node 310. Also, in one embodiment, the voltage on the second conductive lines 306 is a select voltage, which is also fixed voltage. By fixed voltage in this context it is meant that all of the second conductive lines 306 that are selected have the same magnitude voltage applied thereto. Thus, in one embodiment, the voltage on the first conductive line 308 is varied in order to apply the multiply voltage. Thus, the multiply circuit 146 may apply a voltage between two terminals of each memory cell (e.g., the difference between S1 and S2). In one embodiment, the voltage difference between S 1 and S2 is the same for each memory cell 352 in the node 310.

In one embodiment, the magnitude of the multiply voltage represents a multiplier. Thus, the same multiplier may be applied to each memory cell 352 in the node 310. The apparatus 300 multiplies the multiplier by a multiplicand that is collectively stored in the memory cell 352 in the node 310, in one embodiment.

Each memory cell 352 passes a memory cell current in response to the multiply voltage applied to that memory cell, in one embodiment. The memory cell current may be passed to the second conductive line 306. Each memory cell 352 causes a current (referred to as a memory cell current) in the second conductive line 306 in response to the multiply voltage applied to that memory cell, in one embodiment. Each memory cell 352 provides a current (referred to as a memory cell current) to the second conductive line 306 in response to the multiply voltage applied to that memory cell, in one embodiment. The memory cell current appears at a node 326 of a second conductive line. Thus, a first memory cell current for memory cell 352(1) flows at node 326(1), a second memory cell current for memory cell 352(2) flows at node 326(2), and a third memory cell current for memory cell 352(3) flows at node 326(3).

The binary weighted summation circuit 150 is configured to multiply and sum the magnitudes of the memory cell currents. Circuit 150 has three multipliers 340(1), 340(2), 340(3) and one summer 350. Reference numeral 340 may be used to refer to a multiplier without reference to a specific multiplier. Each multiplier 340 multiplies a magnitude of a memory cell current by a different power of two, in one embodiment. The powers of two include two raised to the zeroth power, in one embodiment. Thus, multiplication by "1" is included in the concept of multiplication by a different power of two. In the example of FIG. 3A, the powers of two are $2^0$, $2^1$, and $2^2$. Thus, the powers of two start at $2^0$ and progress consecutively to higher powers, in one embodiment. In one embodiment, when there are "r" memory cells 352 in the node 310, the powers start at $2^0$ and end at $2^{(r-1)}$.

As noted above, the magnitude of the multiply voltage may represent a multiplier. In one embodiment, each memory cell 352 stores one digit of a multiplicand. The multiplication by the differ powers of two is what enables each memory cell 352 to store a different digit of the multiplicand, in one embodiment. Thus, each memory cell 352 can be programmed to one of two states. In one embodiment, the magnitude of the memory cell current from each memory cell 352 represents a product of the multiplier by the digit of the multiplicand stored in the particular memory cells.

Multiplying the magnitudes of the memory cell currents by a different power of two may result in multiplied signals. The multiplied signals are currents, in one embodiment. The multiplied signals are digital values, in one embodiment. The multiplied signals are summed by summer 350. In one embodiment, the three multipliers 340(1), 340(2), 340(3) multiply the magnitude of a current, and the summer sums the magnitudes of the three multiplied currents. Circuit 150 output a summed signal from the summer 350. The summed signal represents a product of the multiplier times a multiplicand stored in the node 310.

The way in which the summed signal is analyzed and used may depend on the application. The summed signal is an analog signal, in one embodiment. In one embodiment, the summed signal is input to an analog-to-digital converter (AID), which may generate a multi-bit signal whose value reflects the magnitude of the summed signal. Thus, the multi-bit signal is the product of the multiplier and the multiplicand, in one embodiment. However, it is not required that the summed signal be converted to a digital signal. In one embodiment, a sense amplifier is used to compare the magnitude of the summed signal to a reference current. The sense amplifier may output a signal (e.g., one bit of information) that indicates whether the magnitude of the summed signal is less than or greater than the reference current. In one embodiment, the magnitude of the summed signal may be input to an activation function in an artificial neural network. In some applications, the activation function outputs a "fire" or "don't fire" signal based on the magnitude of the summed signal.

In one embodiment, the binary weighted summation circuit 150 is configured to simultaneously multiply the magnitude of the memory cell current from each memory cell 352 in the node 310 and sum the magnitudes of the multiplied memory cell currents for the selected node 310. The memory cell current from each memory cell 352 is an analog signal, in one embodiment. The binary weighted summation circuit 150 comprises analog circuitry, such as current mirrors, to perform current multiplication and current summing, in one embodiment. The simultaneous operation avoids delays that could otherwise be incurred by converting analog memory cell currents to digital signals, in order to process the memory cell currents. Note that herein a phrase such as "multiply a current" includes inputting a current into analog circuitry (e.g., a current mirror), which passes an output current having a magnitude that is based on the magnitude of the input current.

The apparatus 300 provides for very precise multiplication. For many memory cells, the memory cells can be reliably programmed to one of two physical states, where the physical state has precise physical value. For example, a memory cell with an adjustable resistor can be programmed to either a high resistance state or a low resistance state, wherein there may be relatively little cell to cell variation in the resistance of the high resistance state, and relatively little cell to cell variation in the resistance of the low resistance state. The terms "high resistance state" and "low resistance state," when used together means that the high resistance state has a higher resistance than the low resistance state. In one embodiment, the low resistance state is referred to as a "SET" state and the high resistance is referred to as a "RESET" state. As another example, a memory cell with an adjustable transistor threshold voltage can be programmed to either a high threshold voltage state or a low threshold voltage state, wherein there may be relatively little cell to cell variation in the threshold voltage of the high threshold voltage state, and relatively little cell to cell variation in the threshold voltage of the low threshold voltage. The terms "high threshold voltage state" and "low threshold voltage state," when used together means that the high threshold voltage state has a higher threshold voltage than the low threshold voltage state. Thus, each memory cell 352 should pass a similar memory cell current when it is in the low physical state (e.g., low resistance or low threshold voltage). Likewise, each memory cell 352 should pass a similar memory cell current when it is in the high physical state (e.g., high resistance or high threshold voltage). Moreover, the binary weighted summation circuit 150 can very precisely multiply by one of the powers of two, in one embodiment. Hence, the summed signal may precisely represent multiplication of the multiplier and the multiplicand.

Figure 3B:
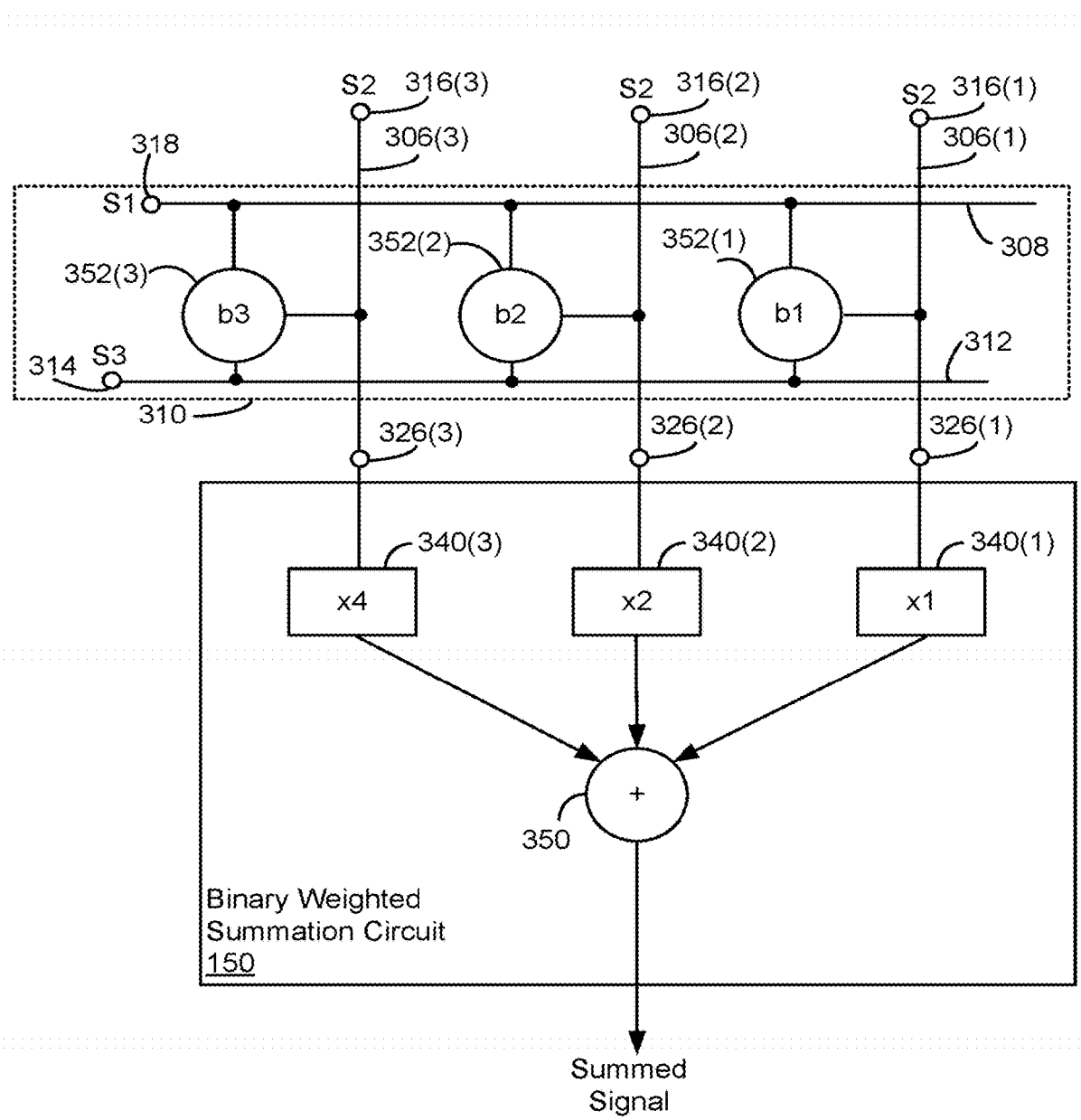
FIG. 3B is a diagram of one embodiment of an apparatus having three-terminal memory cells that may be used to perform multiplication.

In one embodiment, each memory cell 352 is a three-terminal device. FIG. 3B depicts one embodiment of an array 350 in which each memory cell 352 is a three-terminal memory device. The three-terminal architecture adds a third conductive line 312 in addition to a first conductive line 308 and second conductive lines 306. In one embodiment, the third conductive line 312 is referred to as a source line. A voltage S3 is applied to a source terminal 314 of the source line 312.

Some three-terminal memory cells have a transistor. In some embodiments, the gate terminal of the transistor is connected to the first conductive line 308. The gate terminal of the transistor is provided with a fixed voltage during one embodiment of a multiplication operation. By a "fixed voltage" it is meant that when there are more nodes in the array, each first conductive line 308 that is selected receives the same magnitude voltage. Also, in one embodiment, the voltage on the second conductive lines 306 is a select voltage (to select memory cells connected to the second conductive line 306), which is also a fixed voltage. By this it is meant that all of the second conductive lines 306 that are selected have the same magnitude voltage applied thereto. Thus, in one embodiment, the voltage on the third conductive line 312 is varied in order to apply the multiply voltage to a memory cell 352.

A three-terminal memory cell may respond to the multiply voltage by producing a memory cell current that has a magnitude that depends on the physical state (e.g., resistance, Vt) of the memory cell. The memory cell current may depend on the voltage across two of the three terminals. For one type of three-terminal memory cell, the memory cell current may depend on the voltage between the first conductive line 308 and third conductive line 312. Thus, the multiply voltage is applied between the first conductive line 308 and third conductive line 312, in one embodiment. For another type of three-terminal memory cell, the memory cell current may depend on the voltage between the second conductive line 308 and the third conductive line 312. Thus, the multiply voltage is applied between the second conductive line 308 and the third conductive line 308, in one embodiment.

Figure 4A:
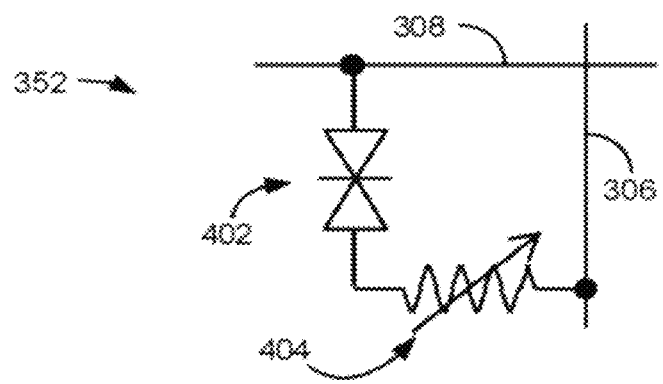
FIG. 4A depicts an example two-terminal device having a selector and an adjustable resistor, which may be used as a memory cell to perform multiplication.

A wide variety of non-volatile memory cells can be used in the memory nodes 310. FIG. 4A shows an example two-terminal memory cell that may be used in one embodiment of FIG. 3A. In this example, the two-terminal device has a selector 402 and an adjustable resistor 404. The adjustable resistor 404 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance-switching material include a phase change material, a ferroelectric material, a metal oxide (e.g., hafnium oxide), a barrier modulated switching structure, or other similar reversible resistance-switching materials. The selector 402 may be a diode, which may be used to reduce leakage currents. The selector 402 is sometimes referred to as a steering element or as an isolation element.

One terminal of the two-terminal device is connected to the first conductive line 308. The other terminal is connected to the second conductive line 306. In the depicted configuration, the selector 402 is directly connected to the first conductive line 308 and the adjustable resistor 404 is directly connected to the second conductive line 306. However, in another configuration, the selector 402 is directly connected to the second conductive line 306 and the adjustable resistor 404 is directly connected to the first conductive line 308. In one embodiment, a multiply voltage is applied between first conductive line 308 and second conductive line 306 during a multiplication operation. The current in the second conductive line 306 depends on the magnitude of the multiply voltage and the resistance of the adjustable resistor 404, in one embodiment. In one embodiment, there is a linear relationship between the magnitude of the multiply voltage and the on-current of the memory cell 352. There may also be a linear relationship between the magnitude of the multiply voltage and the off-current of the memory cell 352, but this is not required.

Figure 4B:
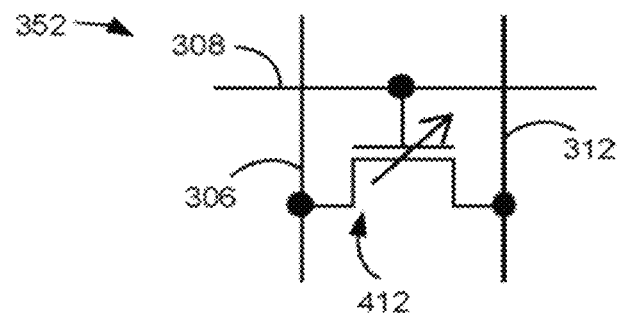
FIG. 4B depicts an example three-terminal device having an adjustable threshold voltage (Vt) transistor, which may be used as a memory cell to perform multiplication.
Figure 4C:
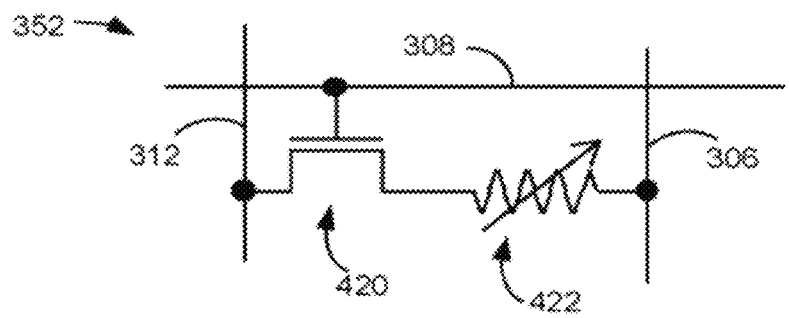
FIG. 4C depicts an example three-terminal device having an access transistor and an adjustable resistor, which may be used as a memory cell to perform multiplication.

In some embodiments, the memory cells 352 in a node 310 are three-terminal memory cells. FIGS. 4B and 4C show two example three-terminal memory cells 352. FIG. 4B depicts a three-terminal device having an adjustable threshold voltage (Vt) transistor 412 that has an adjustable threshold voltage. In one embodiment, the adjustable Vt transistor 412 has a low threshold voltage state and a high threshold voltage state. The high Vt state is a low current (or off) state, in one embodiment. The low Vt state is a high current (or on) state, in one embodiment. The adjustable Vt transistor 412 can be repeatedly switched between the low threshold voltage state and the high threshold voltage state. The adjustable Vt transistor 412 may be a ferroelectric field effect transistor (FeFET).

A first terminal (transistor gate) of the adjustable Vt transistor 412 is connected to the first conductive line 308. A second terminal of the adjustable Vt transistor 412 is connected to the second conductive line 306. The third terminal of the adjustable Vt transistor 412 is connected to the third conductive line 312. In one embodiment, the first conductive line 308 provides a fixed voltage to the gate of the transistor 412 during the multiplication operation. In one embodiment, the voltage to the gate of the adjustable Vt transistor 412 is tuned such that the adjustable Vt transistor 412 operates in the linear regime. If the gate voltage is greater than the sum of the maximum voltage on the third conductive line 312 and the maximum Vt of the adjustable Vt transistor 412, then the adjustable Vt transistor 412 operates in the linear regime, in one embodiment.

In one embodiment, a multiply voltage is applied between the first conductive line 308 and third conductive line 312 during a multiplication operation. The current in the second conductive line 306 depends on the magnitude of the multiply voltage and the Vt of the adjustable Vt transistor 412, in one embodiment. In one embodiment, there is a linear relationship between the magnitude of the multiply voltage and the on-current of the Vt transistor 412. There may also be a linear relationship between the magnitude of the multiply voltage and the off-current of the Vt transistor 412, but this is not required.

FIG. 4C depicts an example three-terminal device, which may be used as a memory cell 352. In this example, the three-terminal device has an access transistor 420 and an adjustable resistor 422. The adjustable resistor 422 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance switching materials include a phase change material, a ferroelectric material, a metal oxide (e.g., hafnium oxide), a barrier modulated switching structure, or other similar reversible resistance-switching materials. Access transistor 420 is a field effect transistor (FET), in one embodiment. Access transistor 420 is a bipolar junction transistor (BJT), in one embodiment.

A first (transistor gate) terminal of the memory cell 352 in FIG. 4C is connected to the first conductive line 308. A second terminal is connected to the second conductive line 306. The third terminal of the memory cell 352 is connected to the third conductive line 312. In one embodiment, the first conductive line 308 provides a fixed voltage to the gate of the access transistor 420 during the multiplication operation. In one embodiment, a multiply voltage is applied between second conductive line 306 and third conductive line 312 during a multiplication operation. The current in the second conductive line 306 depends on the magnitude of the multiply voltage and the resistance of the adjustable resistor 422, in one embodiment. In one embodiment, there is a linear relationship between the magnitude of the multiply voltage and the on-current of the memory cell 352. There may also be a linear relationship between the magnitude of the multiply voltage and the off-current of the memory cell 352, but this is not required.

Figure 4D:
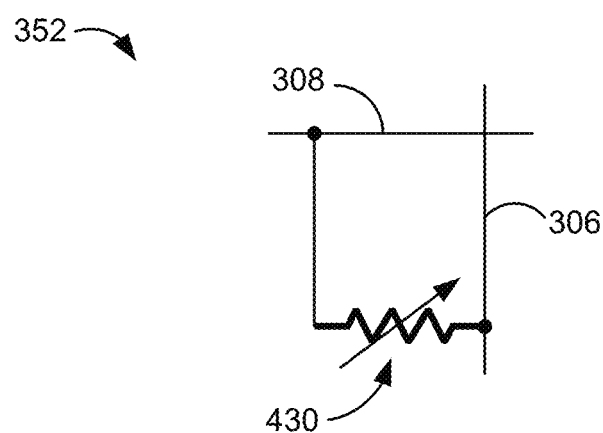
FIG. 4D depicts an example two-terminal device having an adjustable resistor, which may be used as a memory cell to perform multiplication.

FIG. 4D shows an example two-terminal memory cell 352 that may be used in one embodiment of FIG. 3A. The two-terminal memory cell 352 of FIG. 4D may be similar to the two-terminal memory cell 352 of FIG. 4A except that the two-terminal memory cell of FIG. 4D has an adjustable resistor 430 without a selector such as the selector 402. The adjustable resistor 430 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance switching materials include a phase change material, a ferroelectric material, a metal oxide (e.g., hafnium oxide), a barrier modulated switching structure, or other similar reversible resistance-switching materials.

One terminal of the two-terminal device is connected to the first conductive line 308. The other terminal is connected to the second conductive line 306. In the depicted configuration, the adjustable resistor 430 is directly connected to the first conductive line 308 and the adjustable resistor 430 is directly connected to the second conductive line 306. In one embodiment, a multiply voltage is applied between first conductive line 308 and second conductive line 306 during a multiplication operation. The current in the second conductive line 306 depends on the magnitude of the multiply voltage and the resistance of the adjustable resistor 430, in one embodiment. In one embodiment, there is a linear relationship between the magnitude of the multiply voltage and the on-current of the memory cell 352. There may also be a linear relationship between the magnitude of the multiply voltage and the off-current of the memory cell 352, but this is not required. Additional features of memory-cell multiplication are described in U.S. patent application Ser. No. 16/052,420, the entirety of which is incorporated by reference herein.

Multi-Bit Input

Figure 5A:
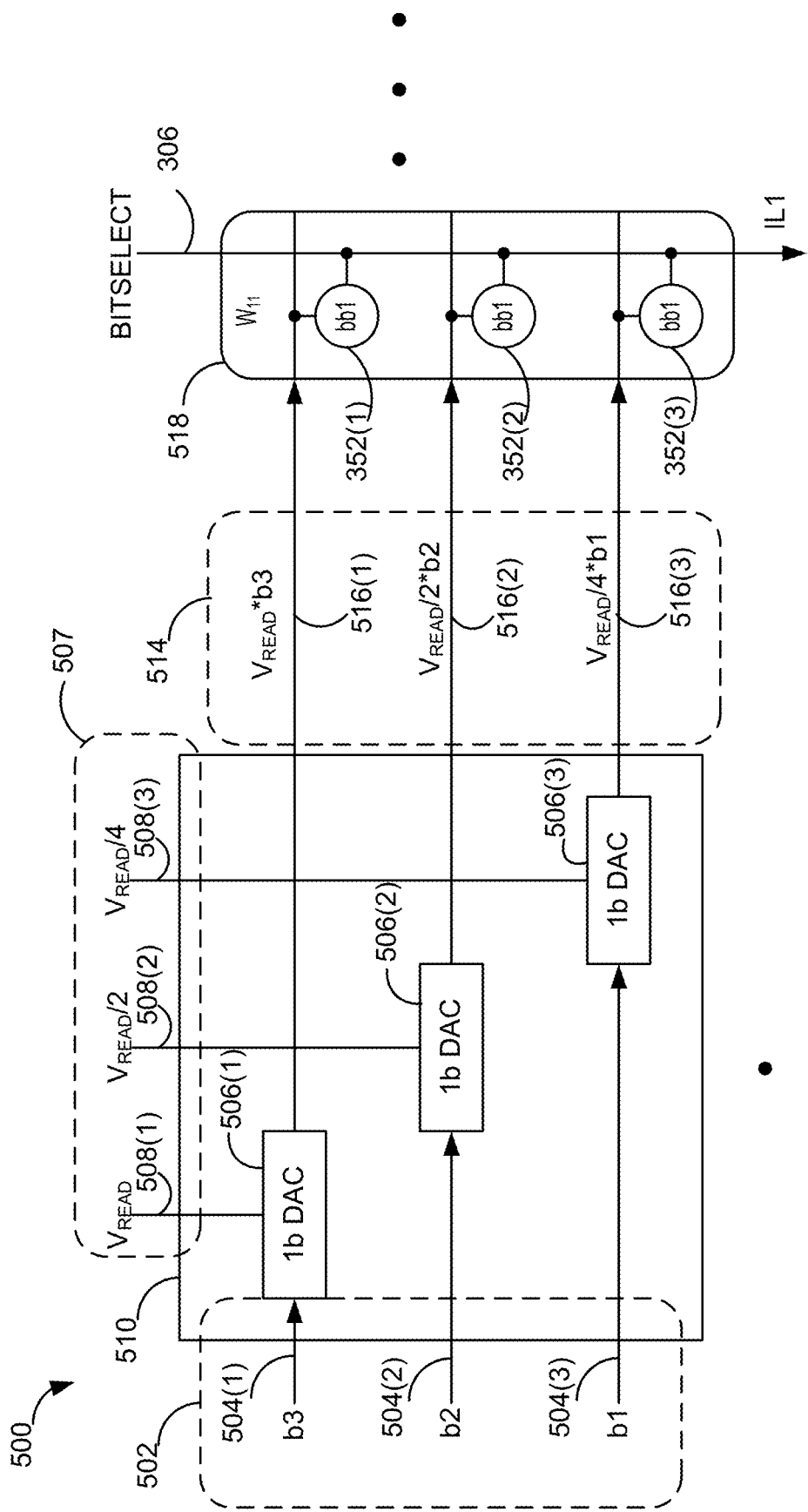
FIG. 5A depicts an example embodiment of a multi-bit input, non-volatile memory cell system for multiplying two numbers.

FIG. 5A depicts a multi-bit input, non-volatile memory cell system 500 for multiplying two numbers. The non-volatile memory cell system 500 includes a set of multi-bit input lines 502, a set of supply voltage lines 507, a multi-bit input circuit 510, a set first conductive lines 514, a set of non-volatile memory cells 518, and a second conductive line 306. The circuit 510 is coupled to the set of multi-bit input lines 502. In one embodiment, the set of multi-bit input lines 502 includes input lines 504(1), 504(2), and 504(3). In general, the set of multi-bit input lines 502 includes N input lines 504(1)-(N). Each input line 504 carries a corresponding bit of N bits such that the set of multi-bit input lines 502 may carry the N bits. For example, the input line 504(1) carries a bit "b3", the input line 504(2) may carry a bit "b2", and the input line 504(1) carries a bit "b1". Each bit may have one of two values, "0" or "1". Each bit may be represented by a voltage magnitude. In one embodiment, the voltage magnitude is held for a predetermined duration. Each bit having a value of "0" may be represented by a magnitude that is lower than a predetermined threshold. For example, a bit having a "0" may be represented by zero volts. Each bit having a value of "1" may be represented by a magnitude that is greater than a predetermined threshold. For example, a bit having "1" may be represented by a magnitude voltage equal to a supply voltage magnitude. In one embodiment, b3 is the most significant bit (MSB), b2 is the next MSB, and b1 is the least significant bit (LSB).

In one embodiment, the circuit 510 includes one-bit (1b) digital-to-analog converters (DACs) 506(1), 506(2), and 506(3). In general, the circuit 510 includes N 1b DACs 506(1)-(N). The 1b DACs 506(1), 506(2), and 506(3) is coupled to the input bit lines 504(1), 504(2), and 504(3), respectively. In general, the 1b DACs 506(1)-(N) is coupled to the input bit lines 504(1)-(N). The 1b DACs 506(1), 506(2), and 506(3) may simultaneously receive the bits b3, b2, and b1, respectively.

The set of supply voltage lines 507 includes supply voltage lines 508(1), 508(2), and 508(3). In general, set of supply voltage lines 507 includes supply voltage lines 508(1)-(N). The 1b DACs 506(1), 506(2), and 506(3) is coupled to supply voltage lines 508(1), 508(2), and 508(3), respectively. In general, the 1b DACs 506(1)-(N) is coupled to the supply voltage lines 508(1)-(N). In one embodiment, each of the supply voltage lines 508(1)-(3) carries a supply voltage that does not exceed a maximum read voltage, $V_{READ}$, of the memory cell 352. The supply voltage line 508(2) carries a supply voltage that has a magnitude that is half of a magnitude of a supply voltage of the supply voltage line 508(1). The supply voltage line 508(3) carries a supply voltage that has a magnitude that is half of a magnitude of a supply voltage of the supply voltage line 508(2). Thus, each successive supply voltage line has a supply voltage magnitude that is half of the supply voltage magnitude of the previous supply voltage line, in one embodiment. In one embodiment, when there are "r" supply voltage lines in the circuit 510, the magnitude of the supply voltage of the $r^{th}$ supply voltage line may be a ratio of the magnitude of the supply voltage of the first supply voltage line and $2^{\wedge}r$.

In one embodiment, a ratio of a magnitude of the multiply voltage in each the 1b DACs 506(1)-(3) and a magnitude of the supply voltage is less than a predetermined threshold. In one embodiment, a magnitude of the multiply voltage in each the 1b DACs 506(1)-(3) is less than or equal to a magnitude of the supply voltage. Each of the 1b DACs 506(1)-(3) may output a multiply voltage that is applied to a memory cell 352. In one embodiment, each supply voltage is selected such that the corresponding multiply voltage does not exceed the $V_{READ}$ of the corresponding memory cell 352, thereby preventing the 1b DAC 506 from overwriting the physical state in the corresponding memory cell 352 that is coupled to the 1b DAC 506.

Each of the 1b DACs 506(1)-(3) converts the respective bit (e.g. b3, b2, b1) and the corresponding supply voltage to a corresponding multiply voltage. Thus, the first 1b DAC 506(1) generates a first multiply voltage, the second 1b DAC 506(2) generates a second multiply voltage, and the third 1b DAC 506(3) generates a third multiply voltage, in one embodiment. In one embodiment, "converting," or the like, means to convert one or more digital bits, such as b3, b2, or b1, to an analog signal, such as the multiply voltage, via circuitry, such as the 1b DAC 506, receiving a power source, such as one of the supply voltages.

The set of first conductive lines 514 includes first conductive line 516(1), first conductive line 516(2), and first conductive line 516(3). The set of first conductive lines 514 includes first conductive lines 516(1)-(N). In one embodiment, the 1b DACs 506(1), 506(2), and 506(3) couple to the first conductive lines 516(1), 516(2), and 516(3), respectively. In general, the 1b DACs 506(1)-(N) is coupled to the first conductive lines 516(1)-(N). In one embodiment, the first conducive lines 516(1)-(3) are word lines.

The 1b DAC 506(1) applies the first multiply voltage to the first conductive line 516(1). Likewise, the 1b DAC 506(2) applies the second multiply voltage to the first conductive line 516(2), and the 1b DAC 506(3) may apply the third multiply voltage to the first conductive line 516(3). The plurality of multiply voltages, that is, the first multiply voltage, the second multiply voltage, and the third multiply voltage, represent a multiplier. The magnitude of the each multiply voltage may be dependent on the respective bit and the supply voltage. For example, if the supply voltage has a magnitude equal to the maximum read voltage, $V_{READ}$, then the magnitude of the first multiply voltage is equal to $V_{READ}*b3$. Likewise, the magnitude of the second multiply voltage is equal to $V_{READ}/2*b2$, and the magnitude of the third multiply voltage may be equal to $V_{READ}/4*b1$.

In one embodiment, the set of first conductive lines 514 is coupled to a set of non-volatile memory cells 518. The set of memory cells 518 includes a memory cell 352(1), a memory cell 352(2), and a memory cell 352(3). In one embodiment, the first conductive lines 516(1), 516(2), and 516(3) are coupled to the memory cells 352(1), 352(2), and 352(3), respectively. The 1b DAC 506(1) applies the first multiply voltage to the first memory cell 352(1), via the first conductive line 516(1). Likewise, the 1b DAC 506(2) applies the second multiply voltage to the second memory cell 352(2), via first conductive line 516(2), and the 1b DAC 506(3) applies the third multiply voltage to the third memory cell 352(3), via the first conductive line 516(3). In general, the set of memory cells 518 includes memory cells 352(1)-(N) coupled to the first conductive lines 516(1)-(N).

In one embodiment, each memory cell 352 includes a resistor. Each memory cell 352 passes a memory cell current to the second conductive line 306 coupled to an output terminal of the memory cell 352. The memory cell current may be based on a resistance of one of the memory cells 352 and the multiply voltage applied to the one of the memory cells 352. The phrase, "apply a multiply voltage to a memory cell," or the like, means to apply the multiply voltage across two terminals of the memory cell. A bit line select voltage is applied to the second conductive line 306. For ease of explanation, it may be assumed that the bit line select voltage is zero volts, such that the voltage across each memory cell 352 is the multiply voltage applied to the respective first conductive line 516. In one embodiment, the second conductive line 306 is a bit line. In one embodiment, the memory cell currents from the set of memory cells 518 combine to form one total memory cell current IL 1.

In one embodiment, the memory cells 352(1)-(3) collectively store one bit of information, such as bb1, that represents a multiplicand. Thus, because the multiplier is represented by the plurality of multiply voltages and the set of memory cells 518 stores a same weight representing the multiplicand, the memory cell current may represent a product of the multiplier and the multiplicand.

In one embodiment, a system includes more than one multi-input circuit 510. In one embodiment, the multiply voltages generated by each circuit 510 are applied to different sets of memory cells 518. In one embodiment, the different sets of memory cells 518 share a same second conductive line 306, causing one total memory cell current. In one embodiment, the different sets of memory cells 518 are coupled to different second conductive lines 306. In one embodiment, the different sets of memory cells 518 cause a plurality of total memory cell currents. In one embodiment, some of the different sets of memory cells 518 are disabled by a respective bit line select voltage.

Figure 5B:
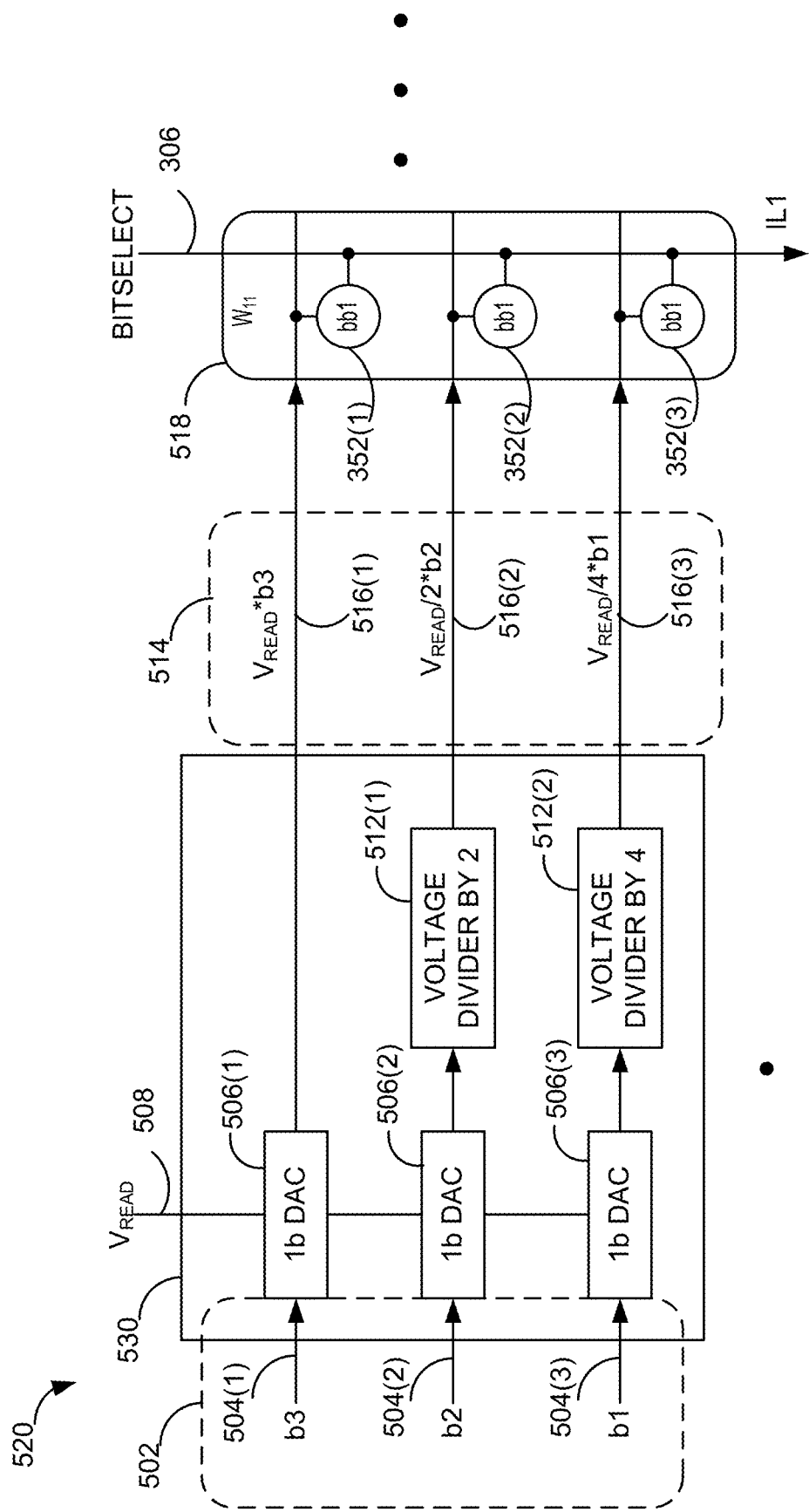
FIG. 5B depicts an example embodiment of a multi-bit input, non-volatile memory cell system for multiplying two numbers.

FIG. 5B depicts an example embodiment of a multi-bit input, non-volatile memory cell system 520 for multiplying two numbers. The system 520 includes a multi-bit input circuit 530. In one embodiment, the circuit 530 is similar to the circuit 510 except for the differences described herein. Each of the 1b DACs 506(1)-(3) is coupled to a same supply voltage line 508. In one embodiment, a magnitude of the supply voltage of the supply voltage line 508 does not exceed $V_{READ}$.

In one embodiment, the circuit 530 includes the voltage dividers 512(1) and 512(2) coupled to the 1b DACs 506(2)-(3). The circuit 530 includes N−1 voltage dividers 512(1)-(N−1) coupled to the 1b DACs 506(2)-(N). Each of the voltage dividers 512(1)-(2) divides a respective multiply voltage by a different power of two. In the example embodiment, the voltage divider 512(1) receives the second multiply voltage and divides the second multiply voltage by $2^1$ in order to generate a final second multiply voltage. The voltage divider 512(2) receives the third multiply voltage and divides the third multiply voltage by $2^2$ in order to generate a final third multiply voltage. Thus, each successive voltage divider divides by a power of two that is one power higher than the power of two by which the previous voltage divider divides, in one embodiment. In one embodiment, when there are "r" voltage dividers 512 in the circuit 510, the first voltage divider 512(1) divides its respective multiply voltage by $2^1$ and the $r^{th}$ voltage divider 512(r) divides its respective multiply voltage by $2^r$. In one embodiment, the circuit 530 includes N voltage dividers 512(1)-(N) coupled to the 1b DACs 506(1)-(N). In one embodiment, the voltage divider 512(1) divides the first multiply voltage by $2^0$.

In one embodiment, the 1b DAC 506(1) and the voltage dividers 512(1)-(2) are coupled to a set of first conductive lines 514. The set of first conductive lines 514 includes first conductive line 516(1), first conductive line 516(2), and first conductive line 516(3). Thus, the 1b DAC 506(1) couples to the first conductive line 516(1), the voltage divider 512(1) couples to the first conductive line 516(2), and the voltage divider 512(2) couples to the first conductive line 516(3).

The 1b DAC 506(1) applies the first multiply voltage to the first conductive line 516(1). Likewise, the voltage divider 512(1) applies the final second multiply voltage to the first conductive line 516(2), and the voltage divider 512(2) applies the final third multiply voltage to the first conductive line 516(3). In one embodiment, the magnitude of the first multiply voltage is equal to $V_{READ}*b3$. Likewise, the magnitude of the final second multiply voltage is equal to $V_{READ}/2*b2$, and the magnitude of the final third multiply voltage may be equal to $V_{READ}/4*b1$.

Figure 5C:
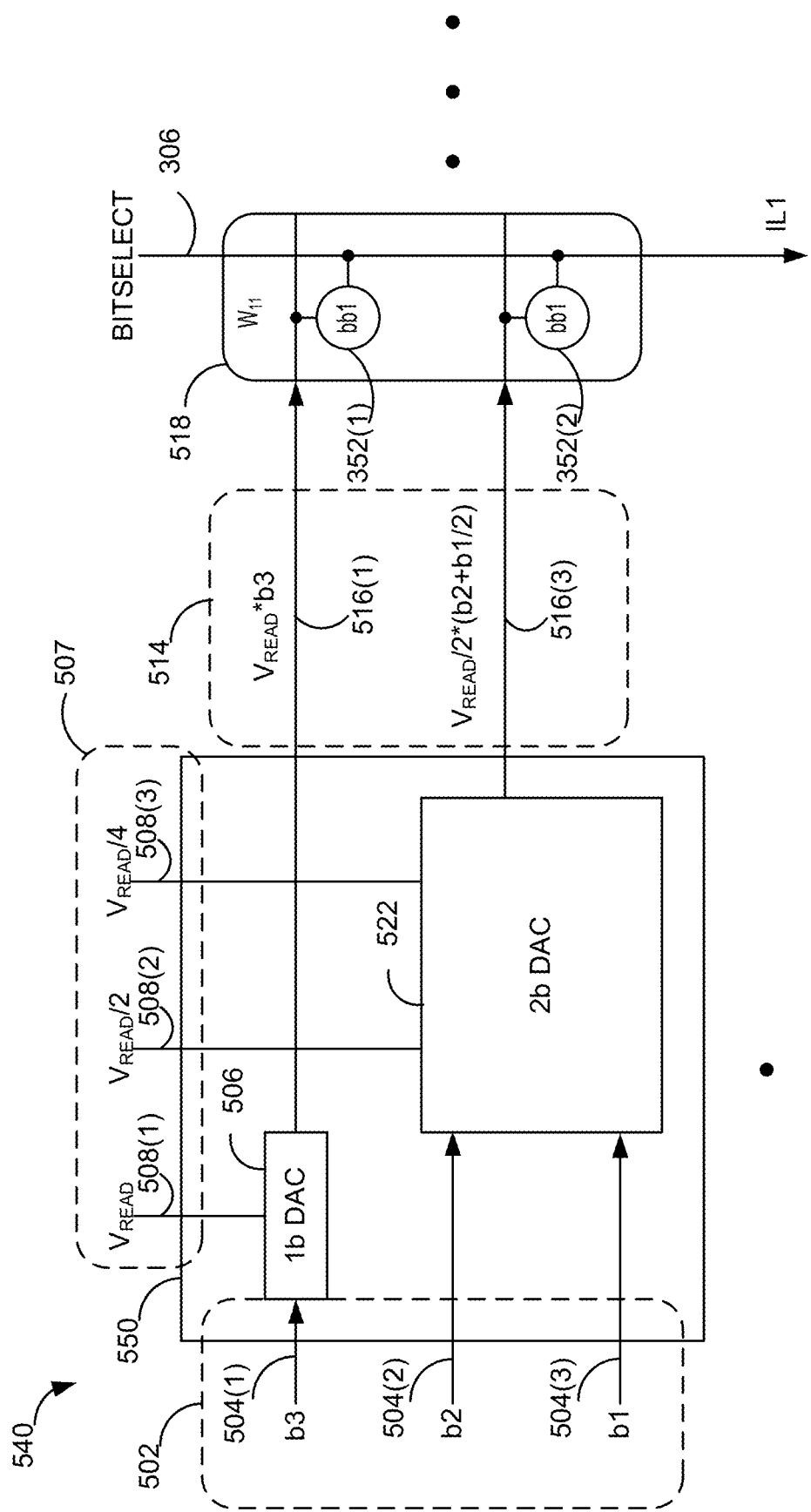
FIG. 5C depicts an example embodiment of a multi-bit input, non-volatile memory cell system for multiplying two numbers.

FIG. 5C depicts an example embodiment of a multi-bit input, non-volatile memory cell system 540 for multiplying two numbers. The system 540 includes a multi-bit input circuit 550. In one embodiment, the circuit 550 is similar to the circuit 510 except for the differences described herein. The circuit 550 includes a 1b DAC 506 and a 2b DAC 522. The 1b DACs 506 is coupled to the input bit line 504(1), and the 2b DAC 522 is coupled to the bit lines 504(2) and 504(3). The 1b DAC 506 and the 2b DAC 522 may simultaneously receive the bits b3, b2, and b1. The 1b DACs 506 is coupled to the supply voltage line 508(1). The 2b DAC 522 is coupled to the supply voltage lines 508(2) and 508(3).

The 1b DAC 506 applies the first multiply voltage to the first conductive line 516(1). The 2b DAC 522 applies the second multiply voltage to the first conductive line 516(2). In one embodiment, the magnitude of the first multiply voltage is equal to $V_{READ}*b3$. The magnitude of the second multiply voltage is equal to $V_{READ}/2*(b2+b½)$.

Figure 5D:
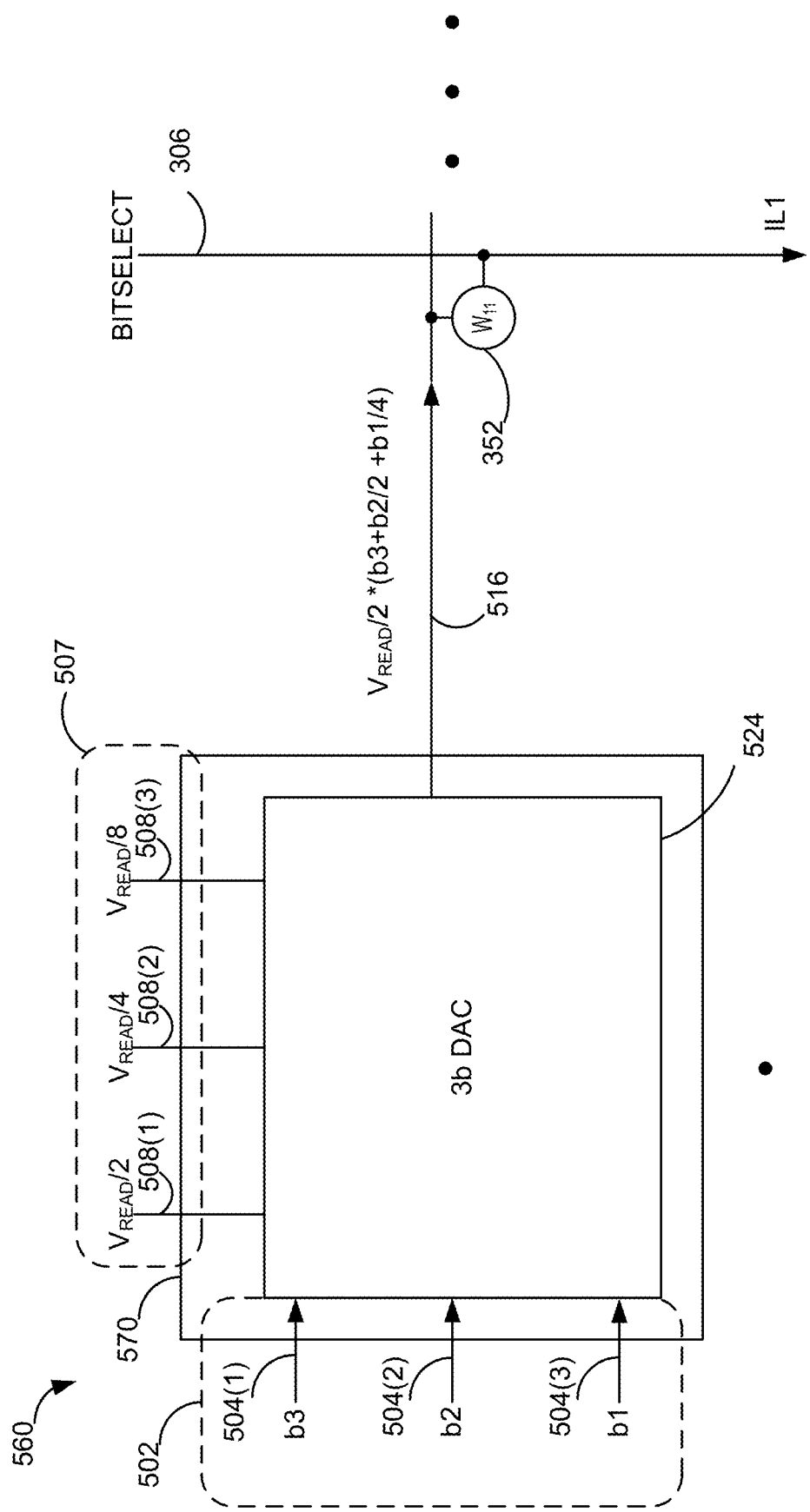
FIG. 5D depicts an example embodiment of a multi-bit input, non-volatile memory cell system for multiplying two numbers.

FIG. 5D depicts an example embodiment of a multi-bit input, non-volatile memory cell system 560 for multiplying two numbers. The system 560 includes a multi-bit input circuit 570. In one embodiment, the circuit 570 is similar to the circuit 510 except for the differences described herein. The circuit 570 includes a three-bit (3b) DAC 524. The 3b DAC 524 is coupled to the input bit lines 504(1)-(3). The 3b DAC 524 may simultaneously receive the bits b3, b2, and b1. The 3b DAC 524 is coupled to the supply voltage lines 508(1)-(3). In one embodiment, the supply voltage line 508(1) carries a supply voltage having a magnitude not exceeding a half of $V_{READ}$. The 3b DAC 524 applies the first multiply voltage to the first conductive line 516, which is coupled to the first terminal of the memory cell 352. In one embodiment, the magnitude of the first multiply voltage is equal to $V_{READ}/2*(b3+b2/2+b¼)$.

In one embodiment, the circuit 570 includes an N-bit (Nb) DAC. The Nb DAC is coupled to the input bit lines 504(1)-(N). The Nb DAC may simultaneously receive N bits. The Nb DAC is coupled to the supply voltage lines 508(1)-(N).

Figure 5E:
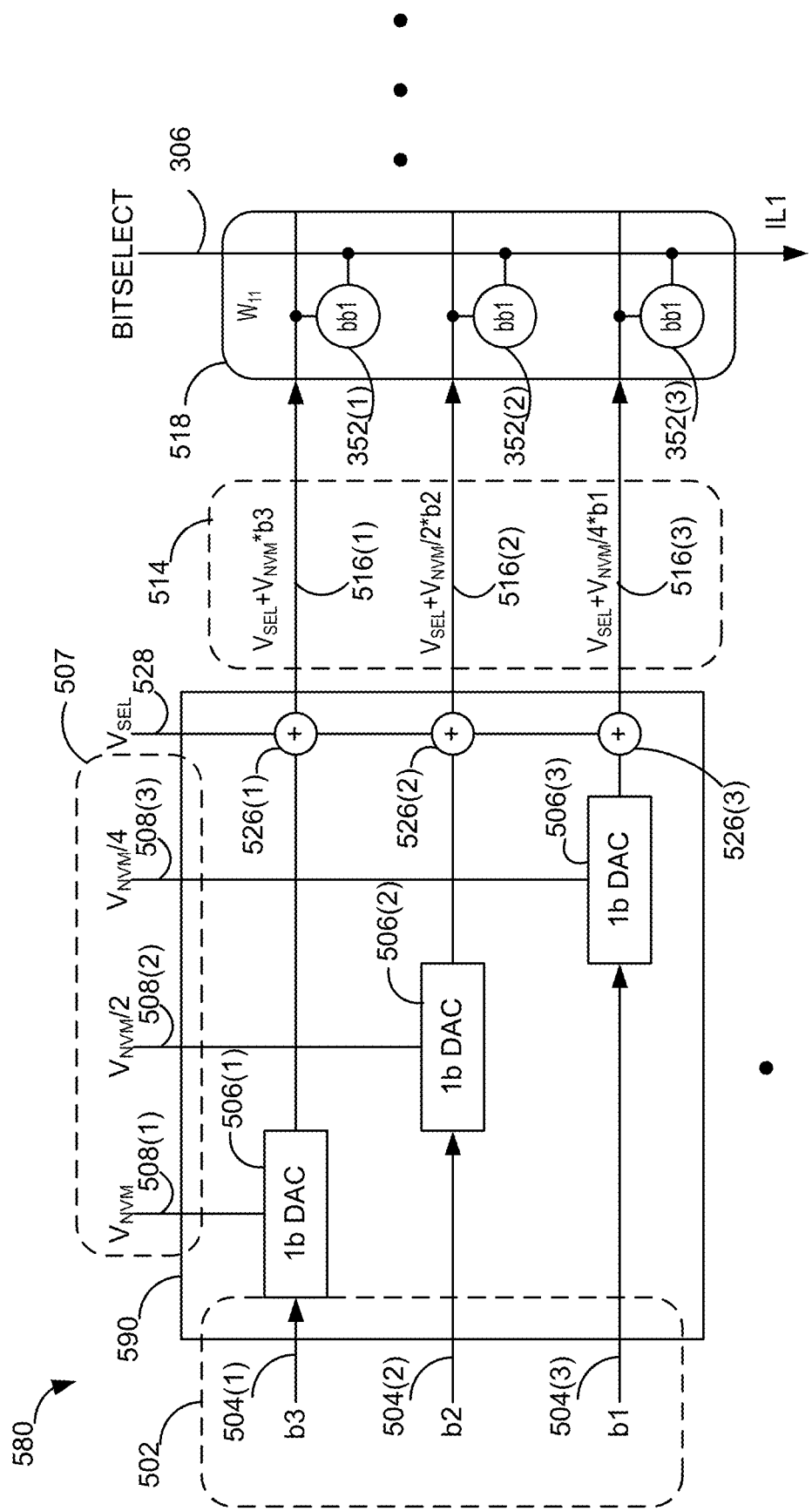
FIG. 5E depicts an example embodiment of a multi-bit input, non-volatile memory cell system for multiplying two numbers.

FIG. 5E depicts an example embodiment of a multi-bit input, non-volatile memory cell system 580 for multiplying two numbers. The system 580 includes a multi-bit input circuit 590. In one embodiment, the circuit 590 is similar to the circuit 510 except for the differences described herein. In one embodiment, each memory cell 352 includes a resistor and one of a transistor or a selector, as described with respect to FIGS. 4A-4C. Without departing from the scope of the disclosure, the embodiments herein are described with respect to the memory cell 352 including a resistor and a selector. The selector may have a first terminal and a second terminal that may be switchably coupled. In one embodiment, the first terminal is coupled to a corresponding first conductive line 516 and the second terminal is coupled to the terminal of a corresponding resistor. The selector may have voltage across its first terminal and second terminal. A copy or estimation of the voltage across the selector is herein referred to as a selector voltage, $V_{SEL}$. The resistor may have a first terminal and a second terminal. The first terminal of the resistor may be coupled to the second terminal of a corresponding selector and the second terminal of the resistor may be coupled to a corresponding second conductive line 306. When the multiply voltage is applied, the resistor may have a resistor voltage, $V_{NVM}$, across its first terminal and second terminal.

The circuit 590 is configured to generate multiply voltages with magnitudes that ensure two characteristics in the presence of the selector: (a) none of the multiply voltages exceed a maximum read voltage and (b) there is a linear relationship between the value of the multi-bit input word being applied to the circuit 590 and a magnitude of the on-current of the memory cell 352. In one embodiment, the 1b DACs 506(1), 506(2), and 506(3) is coupled to supply voltage lines 508(1), 508(2), and 508(3). The voltage supply line 508(1) carries a supply voltage equal to $V_{NVM}$, the voltage supply line 508(2) carries a supply voltage equal to $V_{NVM}/2$, and the voltage supply line 508(3) carries a supply voltage equal to $V_{NVM}/4$. The circuit 590 includes voltage adders 526(1)-(3). The voltage adders 526(1)-(3) are configured to add two voltages to generate a third voltage that is a sum of the two voltages. The voltage adders may be implemented using a summing amplifier, which may include an operational amplifier coupled to two input resistors and a feedback resistor. In one embodiment, the voltage adder may be implemented using a summing amplifier and an inverter to return the output voltage polarity to the polarity of the original inputs of the voltage adder.

The 1b DACs 506(1), 506(2), and 506(3) are coupled to the voltage adders 526(1), 526(2), and 526(3), respectively. The 1b DACs 506(1), 506(2), and 506(3) are each coupled at a first input terminal of the respective voltage adder. A voltage select line 528 couples to a second input of each of the voltage adders 526(1)-(3). The voltage adders 526(1), 526(2), and 526(3) are coupled to the first conductive lines 516(1), 516(2), and 516(3), respectively. The voltage adder 526(1) adds the voltages at its first and second terminals to generate the first multiply voltage and applies the first multiply voltage to the first conductive line 516(1). Likewise, the voltage adder 526(2) adds the voltages at its first and second terminals to generate the second multiply voltage and applies the second multiply voltage to the first conductive line 516(2), and the voltage adder 526(3) adds the voltages at its first and second terminals to generate the third multiply voltage and applies the third multiply voltage to the first conductive line 516(3). The magnitude of the first multiply voltage is equal to $V_{SEL}+V_{NVM}*b3$. Likewise, the magnitude of the second multiply voltage is equal to $V_{SEL}+V_{NVM}/2*b2$, and the magnitude of the third multiply voltage may be equal to $V_{SEL}+V_{NVM}/4*b1$.

In one embodiment, the circuit 590 includes a feedback circuit to provide the voltage adder 526 with the $V_{SEL}$ voltage. The feedback circuit may include resistors coupled to the first and second terminals of the selector. The resistors may be at least an order of magnitude larger than the output impedance of the selector so as to not disrupt operation of the selector. The feedback circuit may sense a magnitude of the voltage across the first and second terminals of the selector in the memory cell 352. The feedback circuit may include a voltage buffer coupled to the resistors. The feedback circuit may generate $V_{SEL}$ by buffering the sensed voltage. The feedback circuit may include a voltage buffer to buffer the sensed voltage. The voltage buffer may copy or estimate a magnitude of the voltage across the selector when generating $V_{SEL}$. The voltage buffer may transform an output impedance across the two terminals of the selector to an a lower output impedance at the output of the voltage buffer. The output of the voltage buffer may be coupled to the voltage select line 528. The voltage buffer may apply $V_{SEL}$ to the voltage select line 528.

In one embodiment, the voltage adders 526 and the voltage select line 528 of the circuit 590 can be combined with any of the circuits 530, 550, and 570 to make the respective circuits compatible with memory cells 352 that include a transistor or a selector. In one embodiment, a circuit of the circuits 530, 550, or 570 can include a number of the voltage adders 526 that is equal to a number of memory cells 352 in the given circuit.

Figure 6B:
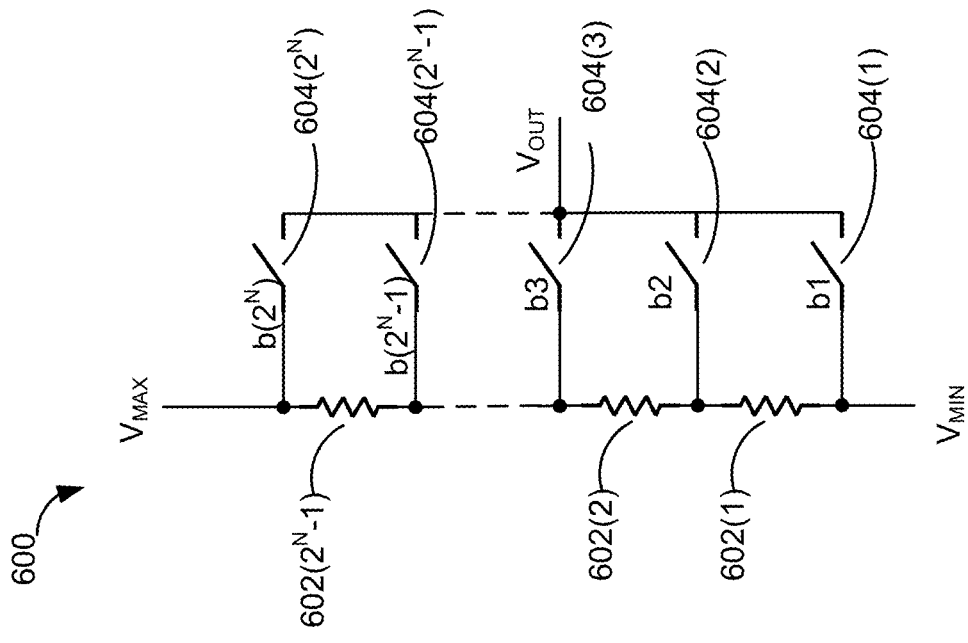
FIG. 6B depicts an example embodiment of an Nb DAC.
Figure 6A:
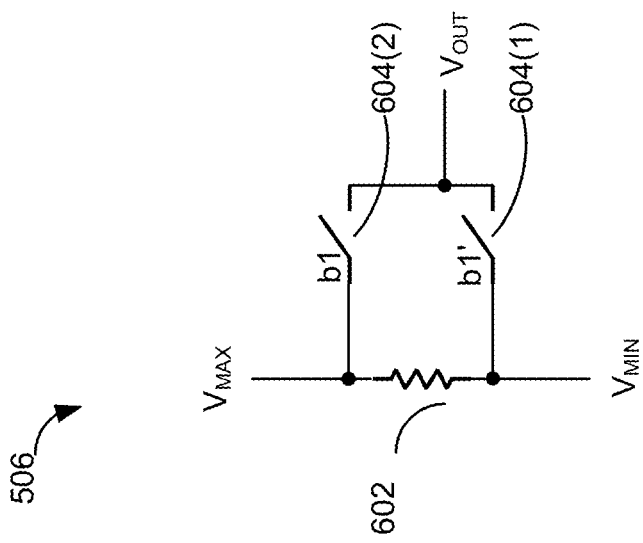
FIG. 6A depicts an example embodiment of the 1b DAC.

FIG. 6A depicts an example embodiment of the 1b DAC 506. The 1b DAC 506 includes a resistor 602 having a first node coupled to a minimum voltage, $V_{MIN}$, and a second node coupled to a maximum voltage, $V_{MAX}$. In one embodiment, a first terminal of a switch 604(1) is coupled to the first node and a second terminal of the switch 604(1) is coupled to an output node. In one embodiment, a first terminal of a switch 604(2) is coupled to the second node and a second terminal of the switch 604(2) is coupled to the output node. In one embodiment, a bit, b1, is applied to the switches 604(1)-(2). If b1 satisfies a first threshold (e.g. above a first predetermined threshold), the switch 604(1) opens and the switch 604(2) closes, coupling the second node to the output node, so that $V_{MAX}$ is applied at the output node. If b1 satisfies a second threshold (e.g. below a second predetermined threshold), the switch 604(2) opens and the switch 604(1) closes, coupling the first node to the output node, so that $V_{MIN}$ is applied at the output node.

In one embodiment, $V_{MAX}$ is equal to $V_{READ}$. In one embodiment, $V_{MAX}$ is equal to $V_{VNM}$. In one embodiment, $V_{MIN}$ is equal to zero volts. In one embodiment, $V_{MIN}$ is equal to $V_{SEL}$. In one embodiment, each of the switches 604(1)-(2) are three-terminal devices. In one embodiment, each of the switches 604(1)-(2) are field-effect transistors. In one embodiment, one of the drain or the source is coupled to the resistor node, one of the drain or the source is coupled to the output node, and the gate is coupled to the bit.

Figure 6C:
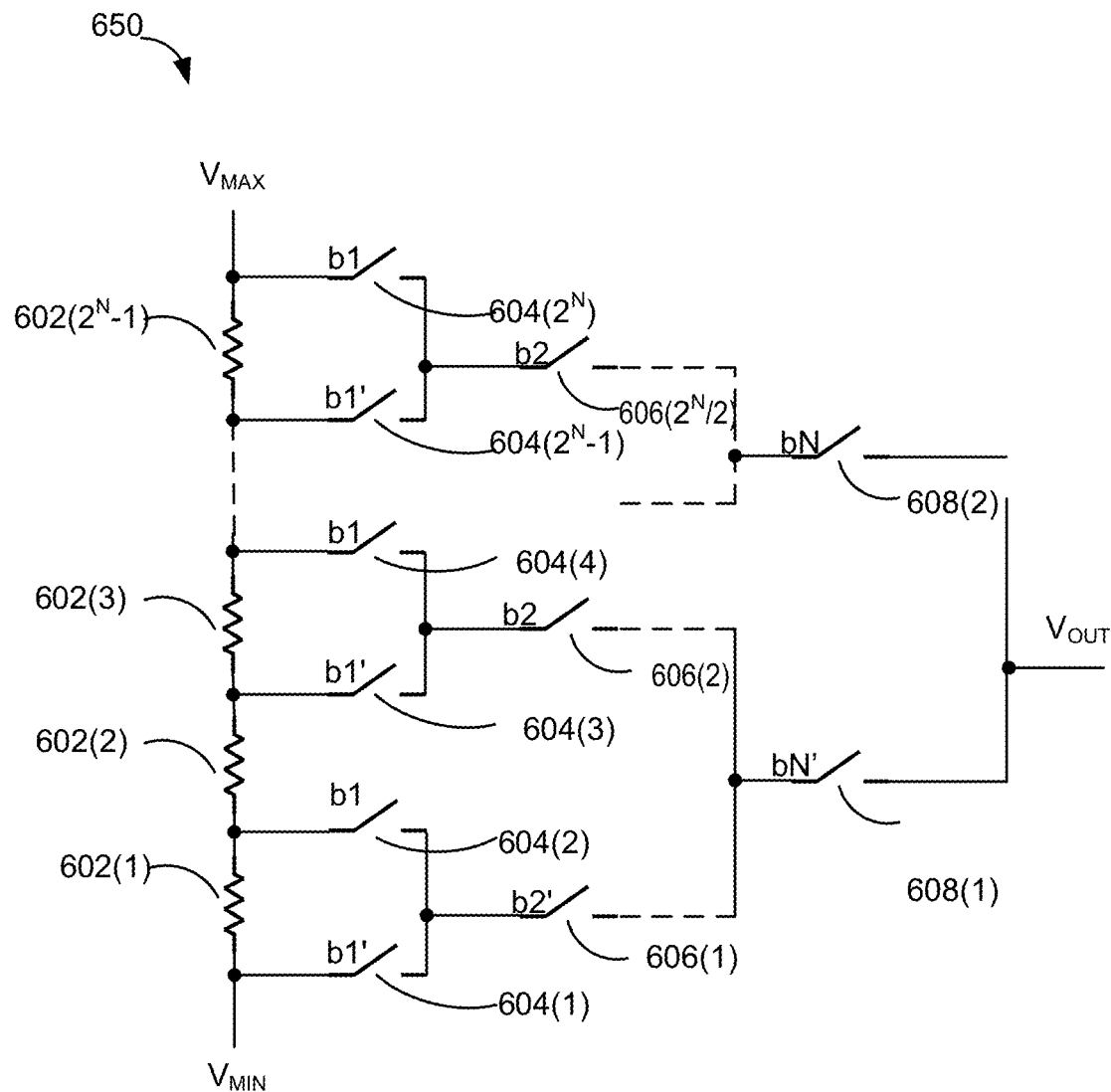
FIG. 6C depicts an example embodiment of the Nb DAC.

FIGS. 6B and 6C depict example embodiments of an Nb DAC. In the example embodiments, the Nb DAC includes a string of series resistors having resistor nodes with voltages on each of the resistor nodes. The Nb DAC includes a switch network comprising N switch paths. Each switch path is switchably coupled between one of the resistor nodes and an output. The switch network is controlled by the plurality of bits carried by the set of multi-bit input lines 502. In the example embodiments, the Nb DAC selects one of the resistor node voltages as the multiply voltage by switchably coupling one of the resistor nodes to the output via the corresponding switch path.

FIG. 6B depicts an example embodiment of an Nb DAC 600. The Nb DAC 600 includes $2^N-1$ resistors 602(1)-($2^N-1$). In one embodiment, the resistors are in series such that a first node of the resistor 602(1) is coupled to $V_{MIN}$, a second node of the first resistor 602(1) is coupled to a first node of the resistor 602(2), a second node of the resistor 602(2) is coupled to a first node of the resistor 603(3), and so on. A second node of the resistor 602($2^N-1$) is coupled to $V_{MAX}$. As a result of the series resistor configuration, there are $2^N$ resistor nodes associated with the $2^N-1$ resistors. The Nb DAC 600 include $2^N$ switches 604(1)-($2^N$). Each of the $2^N$ switches may have a first terminal coupled to a corresponding resistor node and a second terminal coupled to the output node. Each of the $2^N$ switches may be controlled by a different bit. For example, if a first bit, b1, satisfies a predetermined threshold, the switch 604(1) closes, coupling $V_{MIN}$ to the output node. If a second bit, b2, satisfies a predetermined threshold, the switch 604(2) closes, coupling the resistor node between the resistors 602(1) and 602(2) to the output node. The voltage at any resistor node can be determined as $M/2^N*(V_{MAX}-V_{MIN})+V_{MIN}$, where M is a node distance from the node that is connected to $V_{MIN}$. For example, the voltage at the resistor node between the resistors 602(1) and 602(2) is $\frac{1}{2}^N*(V_{MAX}-V_{MIN})+V_{MIN}$.

FIG. 6C depicts an example embodiment of the Nb DAC 650. In one embodiment, the Nb DAC 650 is similar to the Nb DAC 600 except for the differences described herein. A first column of switches 604(1)-($2^N$) each has a first terminal coupled to one of the $2^N$ resistor nodes and a second terminal coupled to a corresponding first intermediate node. Each of the first column of switches 604(1)-($2^N$) is controlled by a first bit, b 1. For example, if b1 satisfies a first predetermined threshold, one half of the switches 604 may be closed, such as 604(1), 604(3), and so on, until and including 604($2^N-1$). If b1 satisfies a second predetermined threshold, a second half of the switches 604 are closed, such as 604(2), 604(4), and so on, until and including 604($2^N$). A second column of switches 606(1)-($2^N/2$) may each have a first terminal coupled to one of the first intermediate nodes and a second terminal coupled to a corresponding second intermediate node. Each of the second column of switches 606(1)-($2^N/2$) is controlled by a second bit, b2, such that half of the switches 606(1)-($2^N/2$) close depending on the state of b2. There may be N columns of switches, with each successive column having half the switches of the previous column. For example, if N=3, there is a third column of switches 608(1) and 608(2). The third column of switches 606(1)-(2) each has a first terminal coupled to a corresponding second intermediate node and a second terminal coupled to the output node. Each of the third row of switches 606(1)-(2) is controlled by a third bit, b3, similarly to how the 1b DAC switches are controlled by b1 with respect to FIG. 6A. Based on the set of bits b1 to bN, one of the resistor nodes is coupled to the output node, and the voltage on the selected resistor node is applied to the output node.

Figure 7:
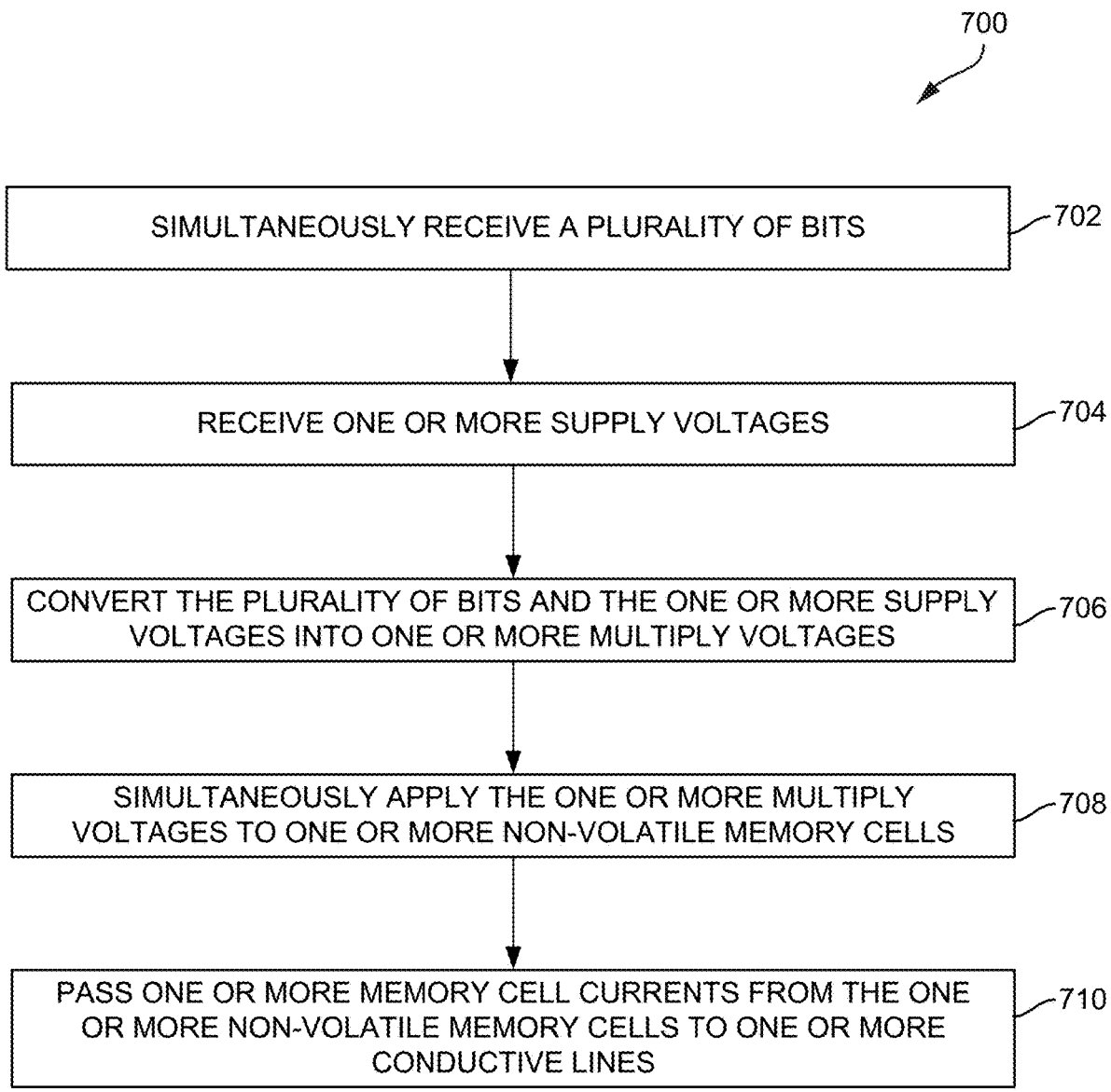
FIG. 7 depicts an example flow chart of a process of multiplying two numbers using a multi-bit input, non-volatile memory cell system.

FIG. 7 depicts an example flow chart of a process 700 of multiplying two numbers using a multi-bit input, non-volatile memory cell system. The process 700 may be performed by a non-volatile memory system such as the non-volatile memory system 500. In one embodiment, the process 700 may be performed by a multi-bit input circuit such as the multi-bit input circuit 510. Additional, fewer, or different operations may be performed in the process 700 depending on the embodiment. The non-volatile memory system simultaneously receives a plurality of bits (702). The non-volatile memory system receives one or more supply voltages (704). The non-volatile memory system converts the plurality of bits and the one or more supply voltages into one or more multiply voltages (706). The non-volatile memory system simultaneously applies the one or more multiply voltages to one or more non-volatile memory cells (708). The non-volatile memory system passes one or more memory cell currents from the one or more non-volatile memory cells to one or more conductive lines (710).

Figure 8:
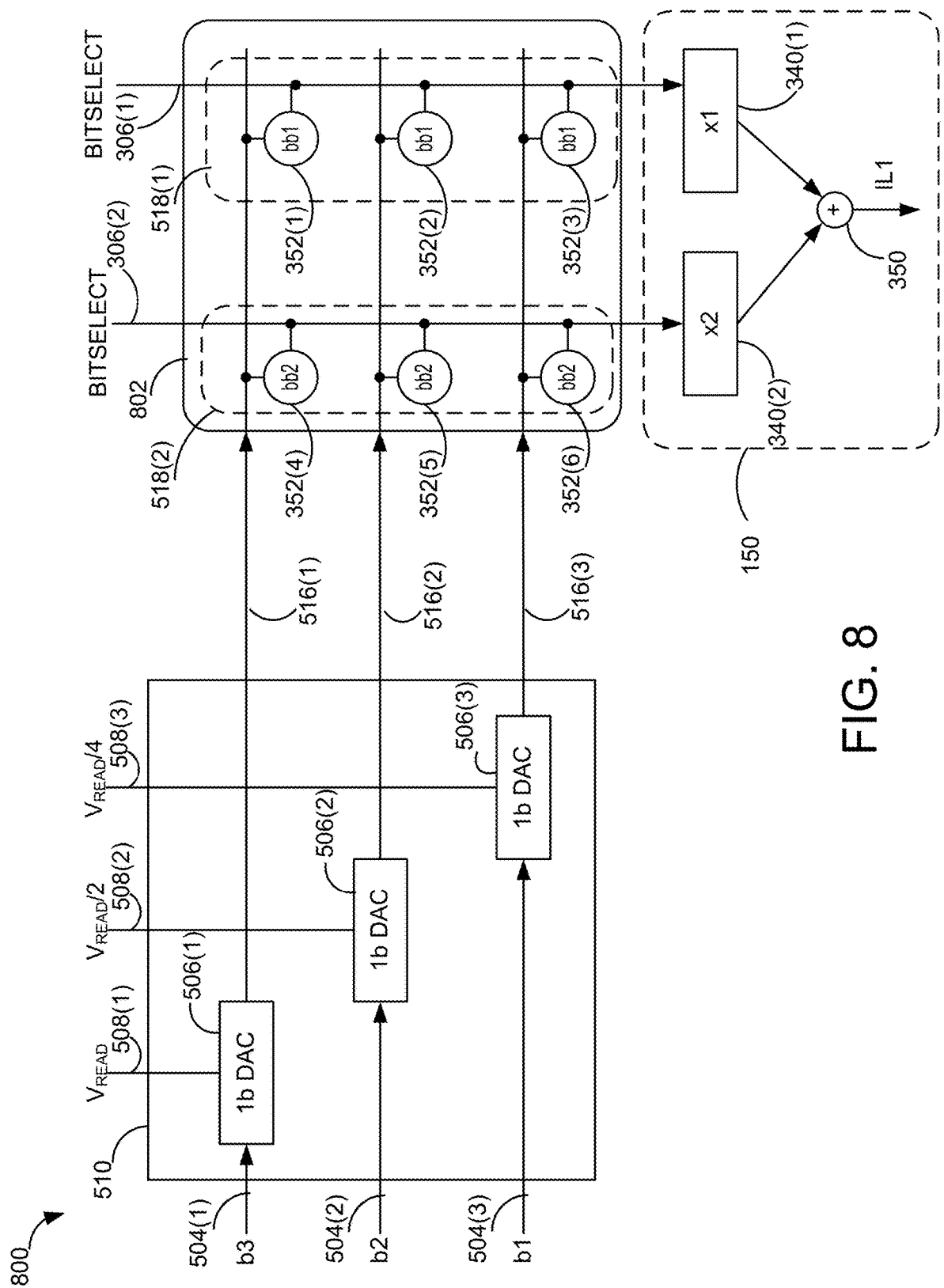
FIG. 8 depicts an example embodiment of a multi-bit input, multi-bit weight, non-volatile memory cell system for multiplying two numbers.

FIG. 8 depicts an example embodiment of a multi-bit input, multi-bit weight, non-volatile memory cell system 800 for multiplying two numbers. The system 800 includes the multi-bit input circuit 510 described with respect to FIG. 5A, a node of memory cells 802, and a binary weighted summation circuit 150, described with respect to FIG. 3A. The circuit 510 includes the 1b DACs 506(1), 506(2), and 506(3), which are coupled at their inputs to the input lines 504(1), 504(2), and 504(3), respectively. The 1b DACs 506(1), 506(2), and 506(3) are coupled to the supply voltage lines 508(1), 508(2), and 508(3), respectively. The 1b DACs 506(1), 506(2), and 506(3) are coupled at their outputs to the first conductive lines 516(1), 516(2), and 516(3), respectively.

The first conductive lines 516(1), 516(2), and 516(3) couple to the node of memory cells 802. The node of memory cells 802 includes a set of memory cells 518(1) and a set of memory cells 518(2). The set of memory cells 518(1) represents a first bit, bb 1, of a weight stored in the node of memory cells 802. The set of memory cells 518(1) includes the memory cells 352(1)-(3). The set of memory cells 518(2) represents a second bit, bb2, of a weight stored in the node of memory cells 802. The set of memory cells 518(2) includes the memory cells 352(4)-(6). The first conductive line 516(1) couples to the memory cells 352(1) and 352(4). The first conductive line 516(2) couples to the memory cells 352(2) and 352(5). The first conductive line 516(3) couples to the memory cells 352(3) and 352(6). The set of memory cells 518(1) couples to the second conductive line 306(1). The set of memory cells 518(2) couples to the second conductive line 306(2).

The binary weighted summation circuit 150 is configured to multiply and sum the magnitudes of the memory cell currents. The circuit 150 has two multipliers 340(1), 340(2), and one summer 350. Each multiplier 340 multiplies each of the memory cell current by a different power of two, in one embodiment. In the example of FIG. 8, the powers of two are 2^0, 2^1. The summer 350 sums the multiplied memory cell currents, and outputs a summed current, in one embodiment. In one embodiment, the magnitude of the summed current represents a product of multiplier (e.g. one input having multiple bits) and a multiplicand (e.g. one weight having multiple bits).

Figure 9:
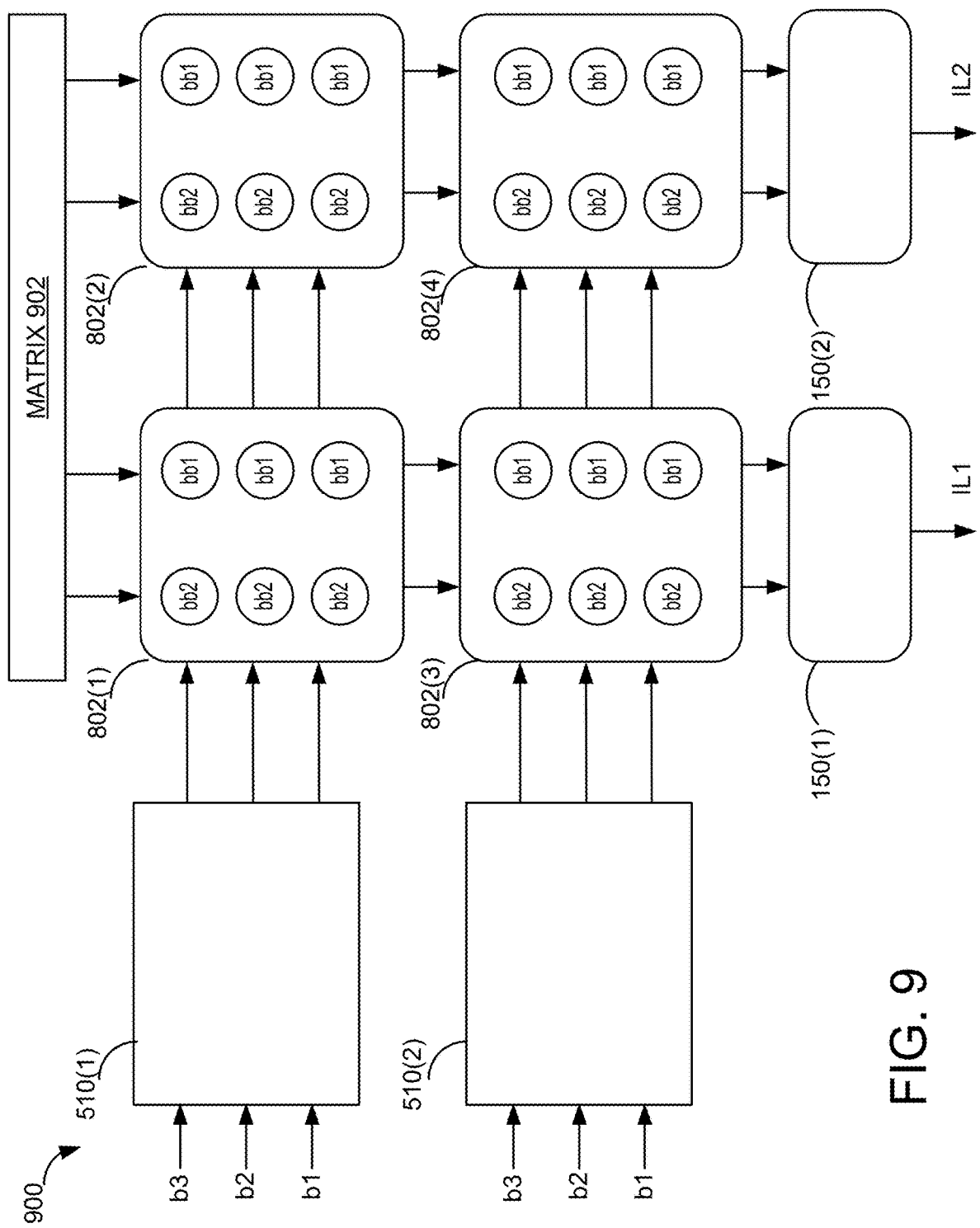
FIG. 9 depicts an example embodiment of a multi-bit input, multi-bit weight, non-volatile memory cell system for multiplying two vectors or multiplying a vector and a matrix.

FIG. 9 depicts an example embodiment of a multi-bit input, multi-bit weight, non-volatile memory cell system 900 for multiplying two vectors or multiplying a vector and a matrix. The system 900 may be an extension of the system 800. The system 900 includes two multi-bit input circuits, 500(1) and 500(2). The multi-bit input circuit 510(1) couples, via first conductive lines, to the node of memory cells 802(1) and the node of memory cells 802(2). The multi-bit input circuit 510(2) couples, via first conductive lines, to the node of memory cells 802(3) and the node of memory cells 802(4). The node of memory cells 802(1) and the node of memory cells 802(3) couples, via second conductive lines, to a binary weighted summation circuit 150 (1). The node of memory cells 802(2) and the node of memory cells 802(4) couples, via second conductive lines, to a binary weighted summation circuit 150(2). A matrix bit select 902 is coupled, via second conductive lines, to each of the node of memory cells 802(1)-(4). The matrix bit select 902 is configured to enable or disable sets of memory cells in the nodes of memory cells 802 that are coupled to a given second conductive line. In one embodiment, the binary weighted summation circuits 150(1)-(2) generates a matrix multiplication result that represents a product of an input vector and a matrix stored in the nodes of non-volatile memory cells 802(1)-802(4). In one embodiment, when the matrix bit select disables the nodes of memory cells 802(2) and 802(4), the binary weighted summation circuits 150(1)-(2) generates a vector multiplication result that represents a product of an input vector and a vector stored in the nodes of non-volatile memory cells 802(1) and 802(3).

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. An apparatus comprising:
a non-volatile memory cell; and
multi-bit input circuitry that:
  simultaneously receives a plurality of bits;
  receives a supply voltage;
  converts the plurality of bits and the supply voltage into a multiply voltage; and
  applies the multiply voltage to the non-volatile memory cell, wherein the nonvolatile memory cell passes a memory cell current in response to the multiply voltage, wherein a magnitude of the multiply voltage represents a multiplier, wherein the memory cell current represents a product of the multiplier and a multiplicand stored in the non-volatile memory cell.

2. The apparatus of claim 1, wherein the non-volatile memory cell comprises:
a resistor; and
one of a selector and a transistor, wherein the one of the selector and the transistor has a first terminal coupled to the resistor and a second terminal, wherein the one of the selector and the transistor has a voltage across the first terminal and the second terminal; and wherein the multi-bit input circuitry comprises:
a digital-to-analog converter (DAC), wherein the DAC converts the plurality of bits and the supply voltage into an intermediate multiply voltage; and
a voltage adder, wherein the voltage adder generates the multiply voltage by adding the intermediate voltage and a selector voltage, wherein the selector voltage is same as the voltage across the first terminal and the second terminal of the one of the selector and the transistor.

3. The apparatus of claim 2, comprising a feedback circuit that:
senses the voltage across the one of the selector and the transistor;
generates the selector voltage by buffering the sensed voltage across the one of the selector and the transistor; and
applies the selector voltage to the voltage adder.

4. The apparatus of claim 1, wherein the multi-bit input circuitry comprises an N-bit (Nb) DAC comprising:
series resistors having N resistor nodes, wherein each of the N resistor nodes has a corresponding one of a plurality of resistor node voltages;
an output resistor node; and
a switch network comprising N switch paths, wherein each switch path of the switch paths is switchably coupled between a corresponding one of the N resistor nodes and the output resistor node, wherein the switch network is controlled by the plurality of bits,
wherein the Nb DAC selects one of the plurality of resistor node voltages as the multiply voltage by switchably coupling a corresponding one of the N resistor nodes to the output resistor node via the corresponding switch path.

5. The apparatus of claim 4, wherein the non-volatile memory cell comprises:
a resistor; and
one of a selector and a transistor; wherein the one of the selector and the transistor has a first terminal coupled to the resistor and a second terminal, wherein the one of the selector and the transistor has a voltage across the first terminal and the second terminal,
wherein a first series resistor of the series resistors receives the supply voltage at a first resistor node of the N resistor nodes, wherein a second series resistor of the series resistors receives a minimum voltage at a second resistor node, wherein the minimum voltage is same as the voltage across the first terminal and the second terminal of the one of the selector and the transistor.

6. The apparatus of claim 1, wherein the multiply voltage comprises a first multiply voltage,
wherein the non-volatile memory cell comprises a first non-volatile memory cell, wherein the plurality of bits comprises a most significant bit (MSB), wherein the multi-bit input circuitry comprises a first one-bit (1b) DAC that:
receives the MSB and the supply voltage; and
converts the MSB and the supply voltage into the first multiply voltage; and
applies the first multiply voltage to the first non-volatile memory cell.

7. The apparatus of claim 6, wherein the multiply voltage comprises a second multiply voltage, wherein the non-volatile memory cell comprises a second non-volatile memory cell, wherein the plurality of bits comprises a second MSB, wherein the multi-bit input circuitry comprises:
a second 1b DAC that:
receives the second MSB and the supply voltage; and
converts the second MSB and the supply voltage into an intermediate multiply voltage; and
a voltage divider that:
receives the intermediate multiply voltage;
converts the intermediate multiply voltage into the second multiply voltage, wherein a magnitude of the second multiply voltage is half of a magnitude of the intermediate multiply voltage; and
applies the second multiply voltage to the second non-volatile memory cell.

8. The apparatus of claim 6, wherein the multiply voltage comprises a second multiply voltage, wherein the non-volatile memory cell comprises a second non-volatile memory cell, wherein the plurality of bits comprises a second MSB, wherein the supply voltage comprises a first supply voltage and a second supply voltage, wherein a magnitude of the second supply voltage is half of a magnitude of the first supply voltage, wherein the first 1b DAC receives the first supply voltage, wherein the multi-bit input circuitry comprises a second 1b DAC that:
receives the second MSB and the second supply voltage;
converts the second MSB and the second supply voltage into the second multiply voltage; and
applies the second multiply voltage to the second non-volatile memory cell.

9. The apparatus of claim 6, wherein the multiply voltage comprises a second multiply voltage, wherein the non-volatile memory cell comprises a second non-volatile memory cell, wherein the plurality of bits comprises a second MSB and a third MSB, wherein the supply voltage comprises a first supply voltage, a second supply voltage, and a third supply voltage, wherein a magnitude of the second supply voltage is half of a magnitude of the first supply voltage, wherein a magnitude of the third supply voltage is half of a magnitude of the second supply voltage, wherein the first 1b DAC receives the first supply voltage, wherein the multi-bit input circuitry comprises a two-bit (2b) DAC that:
receives the second MSB, the third MSB, the second supply voltage, and the third supply voltage;
converts the second MSB of the plurality of bits, the third MSB of the plurality of bits, the second supply voltage, and the third supply voltage into the second multiply voltage; and
applies the second multiply voltage to the second non-volatile memory cell.

10. The apparatus of claim 1, wherein the supply voltage comprises a plurality of supply voltages, wherein a number of the plurality of bits is same as a number of the plurality of supply voltages, wherein the multi-bit input circuitry comprises an Nb DAC that:
receives the plurality of bits and the plurality of supply voltages; and
converts the plurality of bits and the plurality of supply voltages into the multiply voltage.

11. A non-volatile memory system, comprising:
a plurality of non-volatile memory cells comprising "n" rows of non-volatile memory cells and "m" columns of non-volatile memory cells;
"n" first conductive lines, each row of non-volatile memory cells coupled to a corresponding one of the "n" first conductive lines;

"m" second conductive lines, each column of non-volatile memory cells coupled to a corresponding one of the "m" second conductive lines;

multi-bit input circuitry that:
   simultaneously receives a plurality of bits;
   receives a supply voltage;
   converts the plurality of bits and the supply voltage into "n" multiply voltages;
and
   applies each of the "n" multiply voltages to the corresponding one of the "n" first conductive lines, wherein each column of non-volatile memory cells provides a current to the corresponding one of the "m" second conductive lines, wherein a magnitude of a sum of the "n" multiply voltages represents a multiplier; and a binary weighted summation circuit that:
   multiplies a magnitude of the memory cell current from each column of memory cell by a different power of two to produce a multiplied signal for each column of memory cells;
and
   sums the multiplied signals to generate a summed signal that represents a product of the multiplier and a multiplicand stored in each of the plurality of non-volatile memory cells.

12. The non-volatile memory system of claim 11, wherein each of the plurality of nonvolatile memory cells comprises:
a resistor; and
one of a selector and a transistor, wherein the one of the selector and the transistor has a first terminal coupled to the resistor and a second terminal, wherein the one of the selector and the transistor has a voltage across the first terminal and the second terminal; and
wherein the multi-bit input circuitry comprises:
   a digital-to-analog converter (DAC), wherein the DAC converts one bit of the plurality of bits and the supply voltage into an intermediate multiply voltage; and
   a voltage adder, wherein the voltage adder generates a multiply voltage of the "n" multiply voltages by adding the intermediate voltage and a selector voltage, wherein the selector voltage is same as the voltage across the first terminal and the second terminal of the one of the selector and the transistor.

13. The non-volatile memory system of claim 12, comprising a feedback circuit that:
senses the voltage across the one of the selector and the transistor;
generates the selector voltage by buffering the sensed voltage across the one of the selector and the transistor; and
applies the selector voltage to the voltage adder.

14. The non-volatile memory system of claim 11, wherein the multi-bit input circuitry comprises an N-bit (Nb) DAC comprising:
series resistors having N resistor nodes, wherein each of the N resistor nodes has a corresponding one of a plurality of resistor node voltages;
an output resistor node; and
a switch network comprising N switch paths, wherein each switch path of the switch paths is switchably coupled between a corresponding one of the N resistor nodes and the output resistor node, wherein the switch network is controlled by the plurality of bits,
wherein the Nb DAC selects one of the plurality of resistor node voltages as a multiply voltage of the "n" multiply voltages by switchably coupling a corresponding one of the N resistor nodes to the output resistor node via the corresponding switch path.

15. The non-volatile memory system of claim 14, wherein each of the plurality of nonvolatile memory cells comprises:
a resistor; and
one of a selector and a transistor; wherein the one of the selector and the transistor has a first terminal coupled to the resistor and a second terminal, wherein the one of the selector and the transistor has a voltage across the first terminal and the second terminal,
wherein a first series resistor of the series resistors receives the supply voltage at a first resistor node of the N resistor nodes, wherein a second series resistor of the series resistors receives a minimum voltage at a second resistor node, wherein the minimum voltage is same as the voltage across the first terminal and the second terminal of the one of the selector and the transistor.

16. A non-volatile memory system, comprising:
a plurality of non-volatile memory cells comprising "n×r" rows of non-volatile memory cells and "m" columns of non-volatile memory cells;
"n×r" first conductive lines, each row of non-volatile memory cells coupled to a corresponding one of the "n×r" first conductive lines, wherein the "n×r" first conductive lines comprise "r" groups of "n" first conductive lines;
"m" second conductive lines, each column of non-volatile memory cells coupled to a corresponding one of the "m" second conductive lines;
"r" multi-bit input circuits, each multi-bit input circuit coupled to a corresponding group of "n" first conductive lines, each multi-bit input circuit that:
simultaneously receives a plurality of bits;
receives a supply voltage;
converts the plurality of bits and the supply voltage into "n" multiply voltages;
and
   applies each of the "n" multiply voltages to a corresponding first conductive line of the corresponding group of "n" first conductive lines, wherein each column of non-volatile memory cells causes a current in the corresponding one of the "m" second conductive lines, wherein a magnitude of a sum of the "n" multiply voltages represents one of "r" vector elements of a first vector; and
a binary weighted summation circuit that:
   multiplies a magnitude of the memory cell current from each column of memory cell by a different power of two to produce a multiplied signal for each column of memory cells;
and
   sums the multiplied signals to generate a summed signal that represents a multiplication of the first vector and a second vector stored in each of the plurality of nonvolatile memory cells.

17. The non-volatile memory system of claim 16, wherein each of the plurality of nonvolatile memory cells comprises:
a resistor; and
one of a selector and a transistor, wherein the one of the selector and the transistor has a first terminal coupled to the resistor and a second terminal, wherein the one of the selector and the transistor has a voltage across the first terminal and the second terminal; and
wherein each multi-bit input circuit comprises:
a digital-to-analog converter (DAC), wherein the DAC converts one bit of the plurality of bits and the supply voltage into an intermediate multiply voltage; and a voltage adder, wherein the voltage adder generates a multiply voltage of the "n" multiply voltages by adding the intermediate voltage and a selector voltage, wherein the selector voltage is same as the voltage across the first terminal and the second terminal of the one of the selector and the transistor.

18. The non-volatile memory system of claim 17, comprising a feedback circuit that:

senses the voltage across the one of the selector and the transistor;

generates the selector voltage by buffering the sensed voltage across the one of the selector and the transistor; and applies the selector voltage to the voltage adder.

19. The non-volatile memory system of claim 16, wherein each multi-bit input circuit comprises an N-bit (Nb) DAC comprising:

series resistors having N resistor nodes, wherein each of the N resistor nodes has a corresponding one of a plurality of resistor node voltages;

an output resistor node; and a switch network comprising N switch paths, wherein each switch path of the switch paths is switchably coupled between a corresponding one of the N resistor nodes and the output resistor node, wherein the switch network is controlled by the plurality of bits, wherein the Nb DAC selects one of the plurality of resistor node voltages as a multiply voltage of the "n" multiply voltages by switchably coupling a corresponding one of the N resistor nodes to the output resistor node via the corresponding switch path.

20. The non-volatile memory system of claim 19, wherein each of the plurality of nonvolatile memory cells comprises:

a resistor; and one of a selector and a transistor; wherein the one of the selector and the transistor has a first terminal coupled to the resistor and a second terminal, wherein the one of the selector and the transistor has a voltage across the first terminal and the second terminal, wherein a first series resistor of the series resistors receives the supply voltage at a first resistor node of the N resistor nodes, wherein a second series resistor of the series resistors receives a minimum voltage at a second resistor node, wherein the minimum voltage is same as the voltage across the first terminal and the second terminal of the one of the selector and the transistor.

* * * * *